US010817114B2

(12) United States Patent
Sasai et al.

(10) Patent No.: US 10,817,114 B2
(45) Date of Patent: Oct. 27, 2020

(54) CAPACITANCE DETECTION DEVICE FOR DETECTING CAPACITANCE BETWEEN OBJECT PROXIMATE TO DETECTION ELECTRODE AND THE DETECTION ELECTRODE AND INPUT DEVICE USED FOR INPUTTING INFORMATION ACCORDING TO PROXIMITY OF OBJECT

(71) Applicant: ALPS ALPINE CO., LTD., Tokyo (JP)

(72) Inventors: Kiyoshi Sasai, Miyagi (JP); Tatsumi Fujiyoshi, Miyagi (JP); Shinichi Sagawai, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/441,665

(22) Filed: Jun. 14, 2019

(65) Prior Publication Data

US 2019/0294297 A1 Sep. 26, 2019

Related U.S. Application Data

(63) Continuation of application No. PCT/JP2017/041125, filed on Nov. 15, 2017.

(30) Foreign Application Priority Data

Dec. 21, 2016 (JP) ................................ 2016-247475

(51) Int. Cl.
*G06F 3/044* (2006.01)
*G06F 3/041* (2006.01)
(Continued)

(52) U.S. Cl.
CPC .......... *G06F 3/0418* (2013.01); *G01R 27/26* (2013.01); *G01V 3/08* (2013.01); *G06F 3/041* (2013.01);
(Continued)

(58) Field of Classification Search
None
See application file for complete search history.

(56) References Cited

U.S. PATENT DOCUMENTS 6,828,806 B1 12/2004 Hirota et al.
8,633,714 B2 1/2014 Shirai
(Continued)

FOREIGN PATENT DOCUMENTS

JP 2000-234939 8/2000
JP 2001-094408 4/2001
(Continued)

OTHER PUBLICATIONS

International Search Report for PCT/JP2017/041125 dated Feb. 13, 2018.

*Primary Examiner* — Amr A Awad
*Assistant Examiner* — Donna V Lu
(74) *Attorney, Agent, or Firm* — IPUSA, PLLC

(57) ABSTRACT

A capacitance detection device includes a first voltage output circuit configured to output a first alternating current voltage supplied to a shield electrode provided proximate to a detection electrode, a second voltage output circuit configured to output a second alternating current voltage whose frequency and phase are the same as that of the first alternating current voltage and whose amplitude is less than that of the first alternating current voltage, and a current output circuit configured to output a driving current Is to the detection electrode so that the difference between the voltage of the detection electrode and the second alternating current voltage becomes smaller, and output a detection signal corresponding to the driving current. The second voltage output circuit outputs a second alternating current voltage whose amplitude is adjusted so that the driving current in the absence of the object proximate to the detection electrode.

19 Claims, 17 Drawing Sheets

(51) Int. Cl.

| | |
|---|---|
| ***G01V 3/08*** | (2006.01) |
| ***H03F 3/45*** | (2006.01) |
| ***H03K 17/955*** | (2006.01) |
| ***G01R 27/26*** | (2006.01) |

(52) U.S. Cl.
CPC ......... *G06F 3/044* (2013.01); *H03F 3/45475* (2013.01); *H03K 17/955* (2013.01); *G06F 2203/04107* (2013.01); *H03F 2200/129* (2013.01); *H03F 2203/45116* (2013.01); *H03F 2203/45526* (2013.01)

(56) References Cited

U.S. PATENT DOCUMENTS

| | | | | |
|---|---|---|---|---|
| 9,151,792 | B1 | 10/2015 | Kremin et al. | |
| 2011/0285407 | A1 | 11/2011 | Ishizeki et al. | |
| 2014/0306733 | A1* | 10/2014 | Yanagisawa .......... | G01R 15/16 324/99 R |
| 2017/0199598 | A1 | 7/2017 | Fujiyoshi et al. | |

FOREIGN PATENT DOCUMENTS

| | | |
|---|---|---|
| JP | 2011-242370 | 12/2011 |
| JP | 2011-247610 | 12/2011 |
| JP | 2015-125088 | 7/2015 |
| WO | 2016/059967 | 4/2016 |

* cited by examiner

5
I/F
3
PROCESSING UNIT
STORAGE UNIT
4
Ds
2
CAPACITANCE DETECTION DEVICE
Is
Es
Crs
Ea
1
Crg
Crgl
6

2
1
Ds
LPF
263
26
Dx
261
Dm
A/D
25
Vm
24
+
−
Vo
OP1
Rag
Cag
23
Zf
V2
22
Ca
Cb
Is
Es
Crs
Ea
V1
21
Crg
I1
I2
6
Crgl
I3

2
26
263
LPF
Ds
Dx
261
Dm
25
A/D
Vm
24
Vo
23
OP1
Rag
Cag
Zf
V2
22
Ca
Cb
Is
Crsa
1
Es
Ea
Crs
V1
21
Crg
6
Crgl
I3

2
1
6
Crg
I1
Es
Is
Crgl
I3
I2
Crs
Ea
23A
Zf
Rag
Cag
Rs
OP1
−
+
Vo
24
+
−
Vm
25
Dm
26
261
263
Ds
Dx
21
V1
22
Ca
Cb
V2

Ds
26
263
261
Dx
2
Dm
25
Vm
24
+
-
Vo
23B
OP1
Ragz
Cag
Zf
Rs
V2
22
Ca
Cb
1
Is
Es
Crs
Ea
V1
21
Crg
I1
I2
6
Crgl
I3

Ragz
Rag
0.0
-2.5
-5.0
-5.5
-10.0
-12.5
Vo/Vi [dB]
10k
100k
FREQUENCY [Hz]

1
2
23C
Zf
Rag
Cag
Nc
SW1
SW2
OP1
Vo
24
Vm
22
V2
Ca
Cb
N4
N3
N2
N1
SW4
V1
21
Es4
Crs4
Es3
Crs3
Es2
Crs2
Es1
Crs1
Ea4
Ea3
Ea2
Ea1
Crg
Crgl4
Crgl3
Crgl2
Crgl1
6

SECOND HARMONIC / Crs = 130[pF]
SWITCHES ARE PROVIDED IN FEEDBACK LOOP
SWITCHES ARE PROVIDED OUTSIDE FEEDBACK LOOP
S/N [dB]
70.0
65.0
60.0
55.0
50.0
45.0
40.0
-60
-40
-20
0
20
40
60
80
100
120
TEMPERATURE [°C]

2
1
23E
24
Vm
Vo
+
-
OP1
Zf
Ragz
Cag
Nc
SW1
SW2
SW3
SW4
N1
N2
N3
N4
Rs1
Rs2
Rs3
Rs4
NA1
NA2
NA3
NA4
V1
V2
22
Ca
Cb
21
Es1
Es2
Es3
Es4
Crs1
Crs2
Crs3
Crs4
Ea1
Ea2
Ea3
Ea4
Crgl1
Crgl2
Crgl3
Crgl4
Crg
6

CAPACITANCE DETECTION DEVICE FOR DETECTING CAPACITANCE BETWEEN OBJECT PROXIMATE TO DETECTION ELECTRODE AND THE DETECTION ELECTRODE AND INPUT DEVICE USED FOR INPUTTING INFORMATION ACCORDING TO PROXIMITY OF OBJECT

CROSS-REFERENCE TO RELATED APPLICATIONS

The present application is a continuation application of International Application No. PCT/JP2017/041125 filed on Nov. 15, 2017, which claims priority to Japanese Patent Application No. 2016-247475 filed on Dec. 21, 2016. The contents of these applications are incorporated herein by reference in their entirety.

BACKGROUND OF THE INVENTION

1. Field of the Invention

The present invention relates to a capacitance detection device for detecting capacitance between an object and an electrode, and to a capacitive input device such as a touch-pad.

2. Description of the Related Art

Input devices such as touch sensors and touch pads are known for detecting proximity of an object such as a finger based on capacitance. Capacitance detection methods used in the input devices typically include a mutual capacitance detection type and a self-capacitance detection type. In the mutual capacitance detection type, capacitance between two intersecting electrodes is detected, and in the self-capacitance detection type, capacitance of a detection electrode relative to the ground is detected.

The self-capacitance detection type has the advantage of having higher capacitance detection sensitivity than the mutual capacitance detection type. However, the presence of a high capacitance parasitic capacitor between the ground and the detection electrode reduces the detection sensitivity because the component of the parasitic capacitor accounts for a large proportion of the detected signal and the dynamic range of the capacitive component to be detected is reduced. In addition, capacitance fluctuation of the parasitic capacitor causes noise, which reduces the detection accuracy of the capacitance.

In order to reduce the impact of such parasitic capacitors, a shield electrode (also called an active shield) driven at the same potential as the detection electrode is conventionally arranged around the detection electrode (see, e.g., Patent Document 1 below). The arrangement of the active shield reduces the capacitance of the parasitic capacitor because the detection electrode is less susceptible to electrostatic coupling with the surrounding conductor. Also, because the active shield is at the same potential as the detection electrode, the capacitance between the active shield and the detection electrode does not affect the detection result.

CITATION LIST

Patent Document

[Patent Document 1] Japanese Patent Application Publication No. 2001-94408

[Patent Document 2] Japanese Patent Application Publication No. 2011-247610

[Patent Document 3] International Patent Application Publication No. 2016/059967

SUMMARY OF THE INVENTION

Technical Problem

The active shield reduces parasitic capacitor capacitance, but does not eliminate it completely. Therefore, the effect of residual parasitic capacitors is problematic when higher detection sensitivity is required.

In a device described in Patent Document 2, a current corresponding to the measured capacitance is converted to a voltage in the detection circuit, and the output voltage of the detection circuit is input to the correction circuit to correct the phase shift due to the effect of the parasitic capacitor (FIG. 1 of Patent Document 2, etc.). However, because the amplitude of the output voltage of the detection circuit is increased by the effect of the parasitic capacitor, the dynamic range of the measured capacity is reduced and the detection sensitivity is reduced.

On the other hand, in a device disclosed in Patent Document 3, the detected current proportional to the drive current flowing to the capacitor to be detected is output from the current output circuit, and a correction current is applied to the detected current through the correction capacitor, thereby canceling out the increase in the current caused by the parasitic capacitor (FIG. 7 of Patent Document 3, etc.). However, because the capacitance of the correction capacitor needs to be set to a minute (very small) value corresponding to the parasitic capacitor, it is difficult to increase the accuracy of setting the capacitance.

The present invention has been made in view of the above, and it is an object of the present invention to provide a capacitance detection device capable of suppressing the deterioration of the detection sensitivity and detection accuracy due to the effects of the parasitic capacitor, and to provide an input device with the capacitance detection device.

Solution to Problem

A first aspect of the present invention relates to a capacitance detection device that detects a capacitance between an object proximate to a detection electrode and the detection electrode. The capacitance detection device includes: a first voltage output circuit configured to output a first alternating current (AC) voltage supplied to a shield electrode disposed proximate to the detection electrode; a second voltage output circuit configured to output a second alternating current voltage having frequency and phase equal to those of the first alternating current voltage and amplitude less than that of the first alternating current voltage; and a current output circuit configured to output a drive current to the detection electrode so that a voltage difference between a voltage of the detection electrode and the second alternating current voltage is reduced, and to output a detection signal corresponding to the drive current. The second voltage output circuit outputs the second alternating current voltage with amplitude adjusted so that the driving current in the absence of the object proximate to the detection electrode is zero.

According to the above arrangement, a capacitor formed between the detection electrode and the shield electrode (hereinafter referred to as the "shield electrode side capacitor") is provided with an alternating current corresponding to the difference between the first alternating current voltage and the second alternating current voltage. Because the amplitude of the second alternating current voltage is adjusted so that the drive current in the absence of the object proximate to the detection electrode is zero, the alternating current flowing through the shield electrode side capacitor is approximately equal to the alternating current flowing through the parasitic capacitor of the detection electrode (hereinafter simply referred to as a "parasitic capacitor"). In other words, because the alternating current flowing through the shield electrode side capacitor and the alternating current flowing through the parasitic capacitor are canceled out, the drive current contains almost no alternating current due to the parasitic capacitor. Accordingly, the detection signal output from the current output circuit includes almost no components due to the parasitic capacitor. Accordingly, the detection sensitivity and the detection accuracy of the capacitance between the object and the detection electrode (hereinafter referred to as the "detected capacitance") are less susceptible to the effect of the parasitic capacitor.

Preferably, the second voltage output circuit outputs a voltage obtained by attenuating the first alternating current voltage as the second alternating current voltage.

According to the above arrangement, it is possible to generate the second alternating current voltage from the first alternating current voltage using an attenuator. The use of an attenuator that does not include an active element, such as a transistor, reduces the noise of the second alternating current voltage and improves the detection accuracy of the detected capacitance.

Preferably, the second voltage output circuit may include a series circuit of a first capacitor and a second capacitor. The first voltage output circuit may apply the first alternating current voltage to both ends of the series circuit. In the second capacitor, the second alternating current voltage corresponding to the first alternating current voltage may be generated.

According to the above arrangement, the first alternating current voltage is applied to the series circuit of the first capacitor and the second capacitor, and the second alternating current voltage corresponding to the first alternating current voltage is generated in the second capacitor. Therefore, noise is reduced compared to using a resistive attenuator.

Preferably, the capacitance ratio between the first capacitor and the second capacitor may have a value adjusted so that the drive current in the absence of the object proximate to the detection electrode is zero.

According to the above arrangement, the amplitude of the second alternating current voltage is adjusted by adjusting the capacitance ratio between the first capacitor and the second capacitor, thereby canceling the AC current flowing through the shield electrode side capacitor and the AC current flowing through the parasitic capacitor. Therefore, the capacitance of the first capacitor and the second capacitor can be relatively large, regardless of the capacitance of the parasitic capacitor. By increasing the capacitance of the first capacitor and the second capacitor, the accuracy of setting the capacitance ratio is improved, and it is possible to accurately cancel the AC current flowing in the shield electrode side capacitor and the AC current flowing in the parasitic capacitor.

Preferably, the capacitance value of the second capacitor may be adjustable, and the second capacitor may have a capacitance value adjusted so that the driving current in the absence of the object proximate to the detection electrode is zero.

According to the above arrangement, by adjusting the capacitance value of the second capacitor, the amplitude of the second alternating current voltage is adjusted, thereby canceling the AC current flowing through the shield electrode side capacitor and the AC current flowing through the parasitic capacitor. When this AC current cancellation occurs, the capacitance of the second capacitor is easily adjusted because the capacitance of the second capacitor is proportional to the capacitance of the parasitic capacitor.

Preferably, the current output circuit may include an operational amplifier that amplifies a voltage difference between an inverting input terminal connected to the detection electrode and a non-inverting input terminal to which the second alternating current voltage is applied and outputs an amplified result as the detection signal; a feedback capacitor provided in a path between an output terminal of the detection signal of the operational amplifier and the inverting input terminal; a feedback resistor connected in parallel with the feedback capacitor; and a first resistor disposed in a path between the inverting input terminal of the operational amplifier and the detection electrode.

According to the above arrangement, the feedback capacitor, the first resistor, and the operational amplifier form a low pass filter, so that noise input through the detection electrode is attenuated and the detection accuracy deterioration is reduced.

Preferably, the current output circuit may include an operational amplifier that amplifies a voltage difference between an inverting input terminal connected to the detection electrode and a non-inverting input terminal to which the second alternating current voltage is applied and that outputs an amplified result as the detection signal; a feedback capacitor provided in a path between an output terminal of the detection signal of the operational amplifier and the inverting input terminal; a first resistor provided in a path between the inverting input terminal of the operational amplifier and the detection electrode; and a feedback resistor provided in a path between one end of the first resistor connected to the detection electrode and the output terminal of the operational amplifier.

According to the above arrangement, the feedback capacitor, the first resistor, the feedback resistor, and the operational amplifier form a low pass filter, so that noise input through the detection electrode is attenuated and the detection accuracy is improved. Further, because the pole in the transfer function of the gain of the low-pass filter becomes a complex, and the gain is high at the frequency near the pole, the detection sensitivity becomes high.

Preferably, each of the first voltage output circuit and the second voltage output circuit may be capable of changing the frequency of the output alternating current voltage. The first resistor may be a variable resistor whose resistance value is changed according to the frequencies of the first and second alternating current voltages.

According to the above arrangement, the frequencies of the first alternating current voltage and the second alternating current voltage (hereinafter referred to as the "driving frequencies") can be changed, thereby the frequencies can be selected to reduce the effect of noise. Also, it is possible to appropriately set the cut-off frequency of the low pass filter according to the frequencies of the first alternating current voltage and the second alternating current voltage.

Preferably, the capacitance value of the feedback capacitor and the resistance value of the feedback resistor may be adjustable, respectively.

According to the above arrangement, because the capacitance value of the feedback capacitor and the resistance value of the feedback resistor are adjustable, it is possible to properly adjust the phase difference between the first and second alternating current voltages and the detected signal, and the gain of the detected signal relative to the measured capacitance.

Preferably, the current output circuit may include an operational amplifier that amplifies a voltage difference between an inverting input terminal connected to the detection electrode and a non-inverting input terminal to which the second alternating current voltage is applied and outputs an amplified result as the detection signal; and a feedback circuit provided in a path between the output terminal of the detection signal of the operational amplifier and the inverting input terminal. The capacitance detection device may also include a subtraction circuit for subtracting, from the detection signal, a reference alternating current voltage corresponding to an alternating current voltage output as the detection signal from the operational amplifier in the absence of the object proximate to the detection electrode.

According to the above arrangement, the reference alternating current voltage corresponding to an alternating current voltage output as the detection signal from the operational amplifier in the absence of an object proximate to the detection electrode is subtracted from the detection signal. The signal resulting from this subtraction has amplitude approximately proportional to the detected capacitance of the detected signal and becomes minute (very small) in the absence of the object proximate to the detected electrode. Accordingly, the dynamic range of the detected signal corresponding to a change in the detected capacitance is greater, and the detection sensitivity of the detected capacitance is improved.

Preferably, the detection signal and the first alternating current voltage are input to the subtraction circuit and the subtraction circuit subtracts the reference alternating current voltage, which is a voltage attenuated from the first alternating current voltage, from the detection signal.

According to the above arrangement, because the reference alternating current voltage subtracted from the detection signal in the subtraction circuit is a voltage attenuated from the first alternating current voltage, the correlation between the noise component included in the detection signal and the noise component included in the reference alternating current voltage is high, thereby reducing the noise component of the signal resulting from the subtraction of the subtraction circuit.

Preferably, the subtraction circuit may output the result of subtracting the reference alternating current voltage from the detection signal as a differential signal.

According to this configuration, it is possible to form the subtraction circuit using a fully-differential amplifier.

Preferably, the current output circuit includes an operational amplifier that amplifies a voltage difference between an inverting input terminal connected to the detection electrode and a non-inverting input terminal to which the second alternating current voltage is applied and outputs an amplified result as the detection signal; a feedback circuit provided in a path between the output terminal of the detection signal of the operational amplifier and a common node; a first switch circuit that selects one of a plurality of input nodes and connects the one of the input nodes to the common node; and a second switch circuit that selects the same one of the input nodes from the plurality of input nodes and connects it to the inverting input terminal. The plurality of input nodes may be connected to different detection electrodes.

According to the above arrangement, switches of the first switch circuit and the second switch circuit are inserted into a feedback loop between the inverting input terminal of the operational amplifier and the output terminal. A switch based on a MOS transistor, or the like, has a non-linearity in which the conduction resistance varies with the signal level. If the impedance of the feedback circuit at the drive frequency is greater than the impedance on the detection electrode side (mainly the impedance on the shield electrode side capacitor), the effect of the nonlinearity (such as distortion of the detected signal) is suppressed compared to providing a switch in the path between the input node and the detection electrode by providing a switch of the first switch circuit in the path between the input node and the common node. Also, because the inverting input terminal of the operational amplifier has a very high impedance, the effect of the nonlinearity becomes almost zero by providing a switch of the second switch circuit between the input node and the inverting input terminal.

Preferably, the current output circuit may include a plurality of first resistors provided in a plurality of paths between the plurality of input nodes and the plurality of detection electrodes. The feedback circuit may include a feedback capacitor and a feedback resistor connected in parallel.

According to the above arrangement, the feedback capacitor, the first resistor and the operational amplifier form a low pass filter, thereby the noise input through the detection electrode is attenuated and the deterioration of the detection accuracy is reduced.

Preferably, the current output circuit may include a plurality of first resistors provided in a plurality of paths between the plurality of input nodes and the plurality of detection electrodes, a third switch circuit that selects one connection node from a plurality of connection nodes connecting the plurality of detection electrodes to the plurality of first resistors and connects the one connection node to the output terminal of the operational amplifier, and a feedback resistor provided in the path between the third switch circuit and the output terminal. The feedback circuit may include a feedback capacitor.

According to the above arrangement, the feedback capacitor, the first resistor, the feedback resistor, and the operational amplifier form a low pass filter, thereby noise input through the detection electrode is attenuated and the deterioration of the detection accuracy is reduced. Further, because the pole in the transfer function of the gain of the low-pass filter becomes a complex, and the gain is high at the frequency near the pole, the detection sensitivity becomes high.

The second aspect of the present invention relates to an input device for inputting information corresponding to the proximity of an object. The input device includes at least one detection electrode, capacitance between the detection electrode and the object changing in accordance with the proximity of the object, a shield electrode provided proximate to the detection electrode, and a capacitance detection device of the first aspect that detects capacitance between the object and the detection electrode.

Advantageous Effects of Invention

According to the present invention, a capacitance detection device capable of suppressing the deterioration of the detection sensitivity and the detection accuracy due to the effects of a parasitic capacitor, and an input device including the capacitance detection device are provided.

DETAILED DESCRIPTION OF THE PREFERRED EMBODIMENTS

First Embodiment

Figure 1:
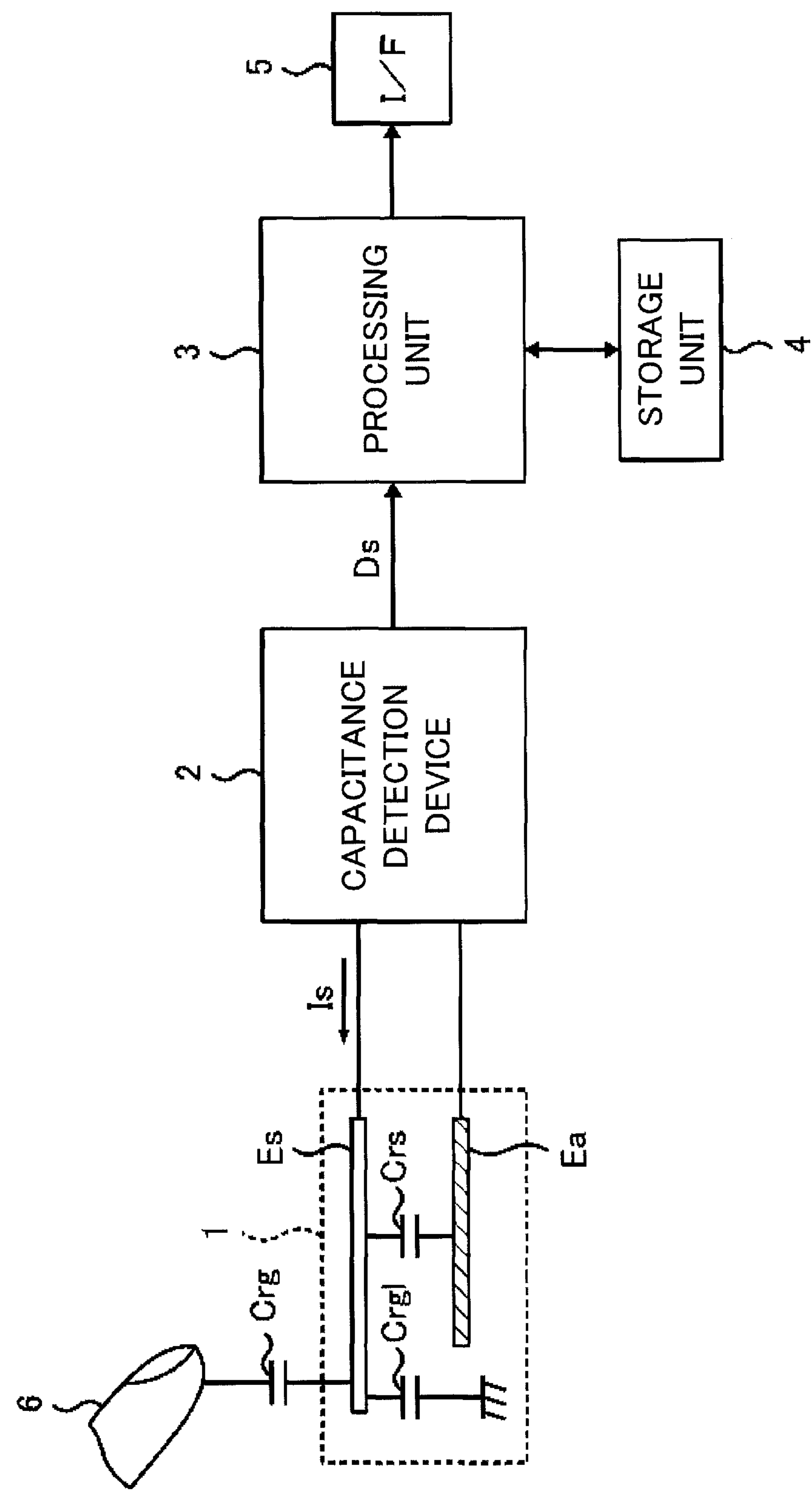
FIG. 1 is a diagram illustrating an example of a structure of an input device according to an embodiment of the present invention.

FIG. 1 is a diagram illustrating an example of a structure of an input device according to an embodiment of the present invention. The input device illustrated in FIG. 1 includes a sensor unit 1, a capacitance detection device 2, a processing unit 3, a storage unit 4, and an interface unit 5.

The input device according to the embodiment detects capacitance between the electrode provided in the sensor unit 1 and an object 6 when the object 6, such as a finger or a pen, is proximate to the sensor unit 1, and inputs information corresponding to the proximity of the object 6 based on the detection result. For example, the input device acquires information such as the proximity of the object 6 to the sensor unit 1 and the distance between the sensor unit 1 and the object 6 based on the detection result of the capacitance. The input device is applied to a user interface device, such as a touch sensor or touch pad. As used herein, the term "proximity" means proximity and does not limit the presence or absence of contact between the adjacent objects.

The sensor unit 1 includes a detection electrode Es for detecting proximity of an object 6, such as a finger or pen, and a shield electrode Ea provided proximate to the detection electrode Es. The detection electrode Es is provided in an area proximate to the object in the sensor unit 1. For example, the surface of the detection area of the object 6 (the area for detecting the object 6) is covered with an insulating cover layer, and the detection electrode Es is provided below the cover layer. The shield electrode Ea is an electrostatic shield for preventing the electrostatic coupling of a conductor other than the object 6 to the detection electrode Es, and is provided below the detection electrode Es in the detection area of the object 6.

As shown in FIG. 1, a capacitor Crg is formed between the detection electrode Es and the object 6, and is a capacitance detection target. A capacitor Crs (shield electrode side capacitor) is formed between the shield electrode Ea and the detection electrode Es. A parasitic capacitor Crgl is also formed between the detection electrodes Es and the ground.

The capacitance detection device 2 detects the capacitance of the capacitor Crg formed between the object 6 and the detection electrode Es and outputs a signal Ds indicating the detection result.

The processing unit 3 is a circuit that controls the overall operation of the input device and includes, for example, a computer that executes processing in accordance with instruction codes of a program stored in the storage unit 4, or a logic circuit that implements a specific function. The processing of the processing unit 3 may be implemented based on the program in the computer, or at least a portion of the processing may be implemented by a dedicated logic circuit.

The processing unit 3 determines whether or not the object 6 is proximate to the sensor unit 1 or calculates the distance between the object 6 and the sensor unit 1 based on the signal Ds of the detected result output from the capacitance detection device 2. It should be noted that, as in embodiments illustrated in FIG. 9, etc., which will be described later, the sensor unit 1 may include a plurality of detection electrodes Es, and the capacitance detection device 2 may detect the capacitance of the capacitor Crg with respect to each of the plurality of detection electrodes Es. In this case, the processing unit 3 may calculate the proximity position of the object 6 and/or the size of the object 6 in the sensor unit 1 based on the signal Ds of the detection result obtained with respect to each the detection electrode Es.

In addition, the processing unit 3 performs a process of changing the frequency of the first alternating current voltage V1 of the capacitance detection device 2 described later in order to avoid decrease in the detection sensitivity of the capacitance detection device 2 due to the influence of external noise.

The storage unit 4 stores a program executed by a computer included in the processing unit 3, data used for the process of the processing unit 3, data temporarily retained in the process, and the like. The storage unit 4 includes any storage device, such as, for example, a DRAM, an SRAM, a flash memory, or a hard disk.

The interface unit 5 is a circuit for exchanging (transmitting/receiving) data between an input device and other devices (e.g., a host controller of an electronic device on which the input device is mounted). The processing unit 3 outputs information obtained based on the detection result of the capacitance detection device 2 (presence or absence of the object 6, proximity position of the object 6, distance from the object 6, the size of the object 6, etc.) to the host device (not shown) via the interface unit 5. In the host device, these information items are used to form a user interface that recognizes/detects, for example, pointing operations or gesture operations.

Figure 2:
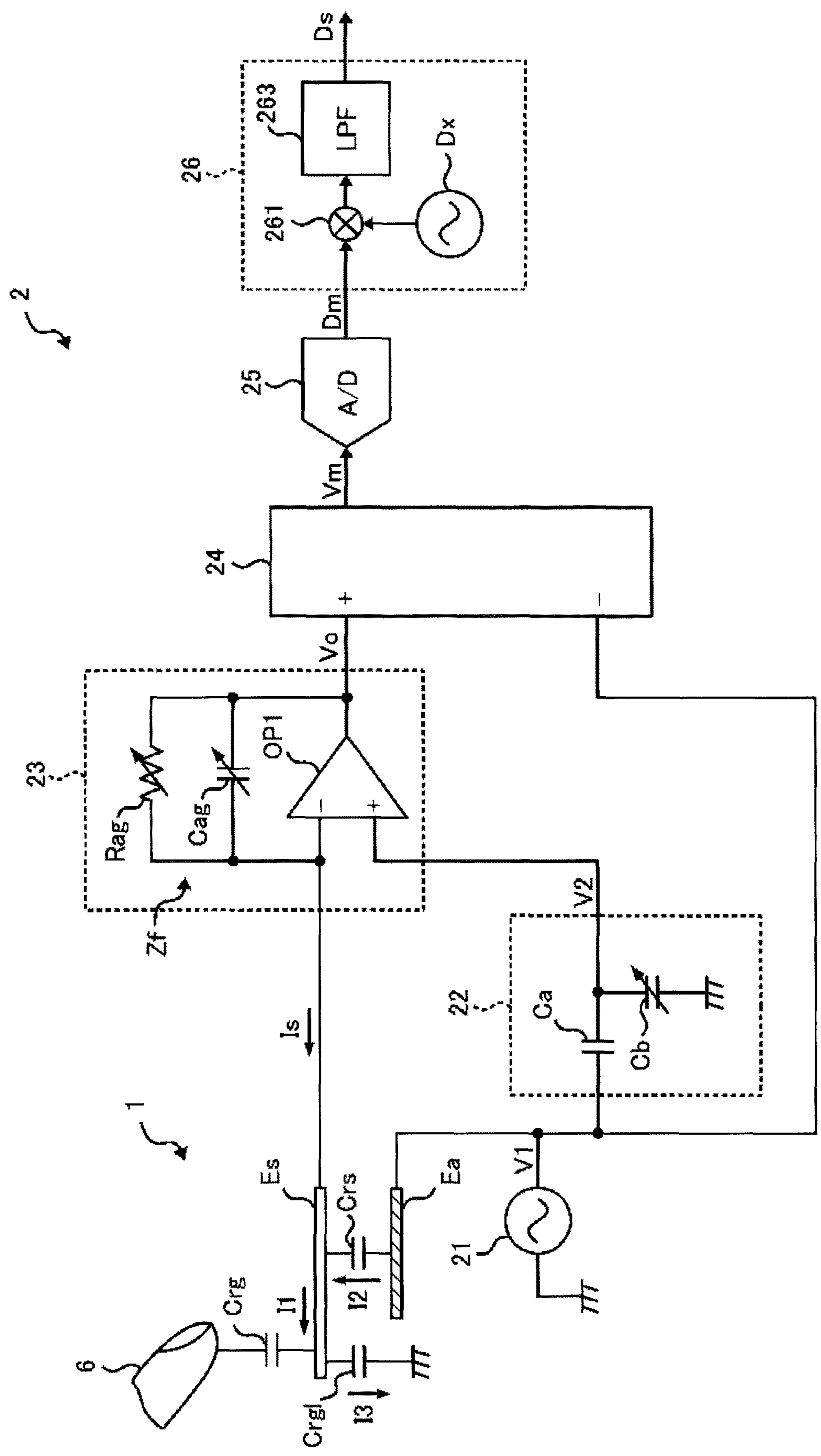
FIG. 2 is a diagram illustrating an example of a structure of a capacitance detection device according to a first embodiment of the present invention.

Next, a configuration/structure of the capacitance detection device 2 will be described. FIG. 2 is a diagram illustrating an example of a configuration/structure of a capacitance detection device 2 according to a first embodiment. The capacitance detection device 2 illustrated in FIG. 2 includes a first voltage output circuit 21 for outputting a first alternating current voltage V1, a second voltage output circuit 22 for outputting a second alternating current voltage V2, a current output circuit 23 for outputting a drive current Is, a subtraction circuit 24, an A/D converter 25, and a signal processing unit 26.

The first voltage output circuit 21 outputs a first alternating current voltage V1 supplied to the shield electrode Ea. For example, the first voltage output circuit 21 generates a first alternating current voltage V1 of a sinusoidal wave having constant amplitude and frequency.

Further, the first voltage output circuit 21 is enabled to change the frequency of the first alternating current voltage V1 according to the control of the processing unit 3. In order to avoid the deterioration of the detection sensitivity due to the close relationship between the frequency of the external noise and the frequency of the first alternating current voltage V1, the processing unit 3 performs the control of changing the frequency of the first alternating current voltage V1.

The second voltage output circuit 22 outputs a second alternating current voltage V2 having the frequency and phase equal to the first alternating current voltage V1 and the amplitude less than the first alternating current voltage V1. The amplitude of the second alternating current voltage V2 is adjusted so that the current I2 flowing through the capacitor Crs (shield electrode side capacitor) and the current I3 flowing through the parasitic capacitor Crgl are canceled out. In other words, the second voltage output circuit 22 outputs a second alternating current voltage V2 whose amplitude is adjusted so that the drive current Is of the current output circuit 23 is zero when the object 6 proximate to the detection electrode Es is not present (when the capacitance of the capacitor Crg is zero).

The second voltage output circuit 22 is, for example, an attenuator, outputting a voltage obtained by attenuating the first alternating current voltage V1 as the second alternating current voltage V2. In the example of FIG. 2, the second voltage output circuit 22 includes a series circuit of the first capacitor Ca and the second capacitor Cb. The first voltage output circuit 21 applies the first alternating current voltage V1 to both ends of the series circuit. The first alternating current voltage V1 is divided by the first capacitor Ca and the second capacitor Cb, resulting in a second alternating current voltage V2 in the second capacitor Cb. One terminal of the first capacitor Ca is connected to the output of the first voltage output circuit 21, the other terminal of the first capacitor Ca is connected to one terminal of the second capacitor Cb, and the other terminal of the second capacitor Cb is connected to the ground.

The capacitance ratio between the first capacitor Ca and the second capacitor Cb is adjusted so that the current I2 flowing through the capacitor Crs (shield electrode side capacitor) and the current I3 flowing through the parasitic capacitor Crgl are canceled out. In other words, the capacitance ratio between the first capacitor Ca and the second capacitor Cb has a value that is adjusted so that the drive current Is in the absence of the object 6 proximate to the detection electrode Es is zero. As shown in Eq. (12) below, when the capacitance ratio between the second capacitor Cb and the first capacitor Ca is equal to the capacitance ratio between the parasitic capacitor Crgl and the capacitor Crs, the current I2 flowing through the capacitor Crs and the current I3 flowing through the parasitic capacitor Crgl are canceled out.

In an example of FIG. 2, the capacitance value of the first capacitor Ca is constant and the capacitance value of the second capacitor Cb is adjusted. In other words, the second capacitor Cb has a capacitance value adjusted so that the drive current Is in the absence of the object 6 proximate to the detection electrode Es is zero. The second capacitor Cb may be a variable-capacitance discrete component or a component formed on a semiconductor chip or the like in an IC. In the latter case, for example, the second capacitor Cb is comprised of a plurality of capacitors connected in parallel, and the capacitance value is adjusted by selecting the number of capacitors connected in parallel, using laser trimming or the like.

The current output circuit 23 outputs the drive current Is to the detection electrode Es so that the voltage difference between the detection electrode Es and the second alternating current voltage V2 is reduced, and outputs a detection signal Vo corresponding to the drive current Is.

In the example of FIG. 2, the current output circuit 23 includes an operational amplifier OP1, a feedback capacitor Cag, and a feedback resistor Rag. The operational amplifier OP1 amplifies the voltage difference between the inverting input terminal connected to the detection electrode Es and the non-inverting input terminal to which the second alternating current voltage V2 is applied, and outputs the amplification result as the detection signal Vo. The feedback capacitor Cag is provided in the path between the output terminal of the detection signal Vo of the operational amplifier OP1 and the inverting input terminal. The feedback resistor Rag is connected in parallel with the feedback capacitor Cag.

In the example of FIG. 2, the capacitance value of the feedback capacitor Cag and the resistance value of the feedback resistor Rag are adjustable, respectively. By adjusting the values of these elements, the phase difference between the first and second alternating current voltages V1 and V2 and the detection signal Vo is adjusted, and the gain of the amplitude of the detection signal Vo with respect to the capacitance value of the capacitor Crg is adjusted. The feedback capacitor Cag and the feedback resistor Rag may be discrete components capable of adjusting the device values, for example, or may be internal components of the IC capable of adjusting the device values, using laser trimming or the like.

The subtraction circuit 24 subtracts from the detection signal Vo a reference alternating current voltage corresponding to an alternating current voltage output as a detection signal Vo from the operational amplifier OP1 in the absence of an object 6 proximate to the detection electrode Es. This subtraction yields an alternating current voltage with amplitude that is roughly proportional to the capacitance of the capacitor Crg. The subtraction circuit 24 includes, for example, a fully-differential amplifier and outputs the result of subtracting the reference alternating current voltage from the detection signal Vo as a differential signal Vm.

Figure 3:
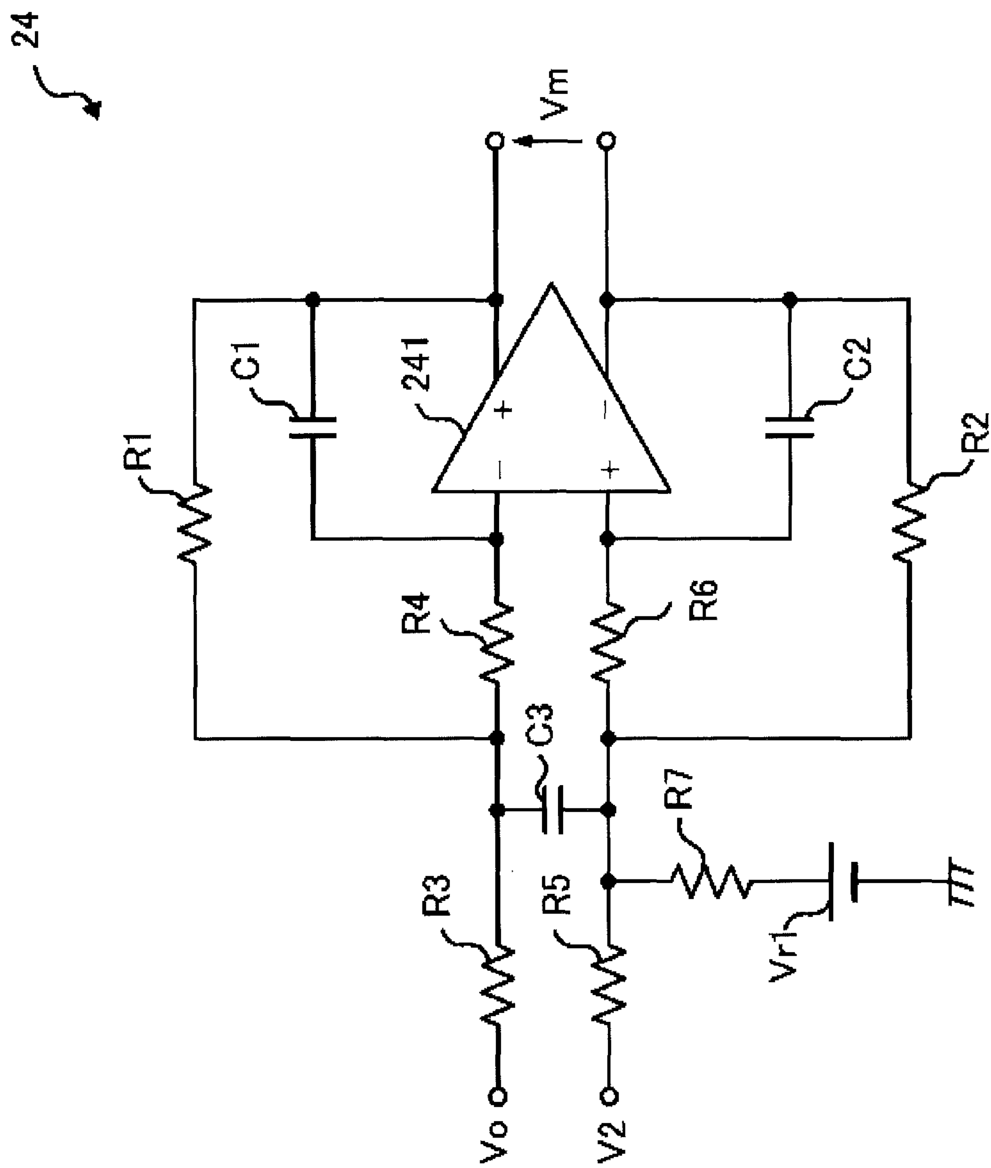
FIG. 3 is a diagram illustrating an example of a structure of a subtraction circuit.

FIG. 3 is a diagram illustrating an example of a configuration of the subtraction circuit 24. In an example of FIG. 3, the subtraction circuit 24 includes a fully-differential amplifier 241, resistors R1-R7, and capacitors C1-C3. The capacitor C1 is connected between the inverting input terminal of the fully-differential amplifier 241 and the non-inverting output terminal. The capacitor C2 is connected between the non-inverting input terminal and the inverting output terminal of the fully-differential amplifier 241. The inverting input terminal of the fully-differential amplifier 241 receives a detection signal Vo via the resistor R3 and the resistor R4 connected in series. A detection signal Vo is input to one end of the resistor R3 and the inverting input terminal of fully-differential amplifier 241 is connected to one end of the resistor R4. The junction of the resistor R3 and the resistor R4 is connected to the non-inverting output terminal of fully-differential amplifier 241 via the resistor R1. The first alternating current voltage V1 is input to the non-inverting input terminal of the fully-differential amplifier 241 via the resistor R5 and the resistor R6 connected in series. The first alternating current voltage V1 is input to one end of the resistor R5 and the non-inverting input terminal of the fully-differential amplifier 241 is connected to one end of the resistor R6.

The junction of the resistor R5 and the resistor R6 is connected to the inverting output terminal of fully-differential amplifier 241 via the resistor R2. The capacitor C3 is connected between the junction of the resistor R3 and the resistor R4 and the junction of the resistor R5 and the resistor R6. Further, a direct current bias voltage Vrl is input to the junction of the resistor R5 and the resistor R6 via the resistor R7.

In the subtraction circuit 24 shown in FIG. 3, the gains for the two inputs (detection signal Vo, first alternating current voltage V1) are different, and the gain of the first alternating current voltage V1 input to the path to which the resistance R7 is connected is smaller than that of the detection signal Vo. In other words, the subtraction circuit 24 amplifies the difference between the alternating current voltage (reference alternating current voltage) attenuated compared to the first alternating current voltage V1 and the detection signal Vo, and outputs the amplification result as the differential signal Vm. Further, the subtraction circuit 24 also comprises a low pass filter to remove the high frequency components input from the object 6 through the capacitor Crg. This low pass filter function reduces the return noise in the A/D converter 25 described below.

Return to FIG. 2.

The A/D converter 25 converts the analog differential signal Vm output from the subtraction circuit 24 to a digital signal Dm. The A/D converter 25 may be, for example, a differential-input type delta-sigma A/D converter.

The signal processing unit 26 extracts a signal Ds proportional to the amplitude of an alternating current component having the same frequency as the first alternating current voltage V1 from the signal Dm output from the A/D converter 25. The signal processing unit 26 includes, for example, a multiplier 261 for multiplying a signal Dx by the signal Dm having the same frequency as the first alternating current voltage V1, as shown in FIG. 2, and a low pass filter 263 for removing the alternating current component from the multiplication result of the multiplier 261. The signal Dm output from the low pass filter 263 has a value that is roughly proportional to the capacitance of the capacitor Crg.

Next, an operation of an input device having the above-described configuration will be described.

When the gain of the operational amplifier OP1 is sufficiently high, the voltage difference between the inverting input terminal of the operational amplifier OP1 and the non-inverting input terminal becomes very small, and the voltage of the inverting input terminal of the operational amplifier OP1 is roughly equal to the second alternating current voltage V2. Here, if it is assumed that the circuit provided in the path between the output terminal of the operational amplifier OP1 and the inverting input terminal (in the example of FIG. 2, the parallel circuit of the feedback capacitor Cag and the feedback resistance Rag) is called a "feedback circuit Zf", and the impedance of the circuit is represented by "Zf", the detection signal Vo is represented by the following equation.

Eq. 1

$$Vo = Is \cdot Zf + V2 \tag{1}$$

If the resistance of the feedback resistor Rag is sufficiently large compared to the impedance of the feedback capacitor Cag at the drive frequency of the first alternating current voltage V1, the detection signal Vo is represented by the following equation:

Eq. 2

$$Vo = \frac{Is}{j\omega Cag} + V2 \tag{2}$$

On the other hand, if it is assumed that the alternating current flowing from the detection electrode Es to the ground is "I1," and the alternating current flowing from the shield electrode Ea to the detection electrode Es is "I2," the driving current Is is expressed by the following equation.

Eq. 3

$$\begin{aligned} Is &= I1 - I2 \\ &= j\omega \cdot (Crg + Crgl)V2 - j\omega Crs \cdot (V1 - V2) \end{aligned} \tag{3}$$

Typically, the capacitance between the object 6 and the ground is sufficiently large compared to the capacitance (Crg) between the object 6 and the detection electrode Es, and the object 6 can be considered grounded at the drive frequency. Therefore, in Eq. (3), the current I1 is calculated assuming that the capacitor Crg is connected in parallel with the parasitic capacitor Crgl.

By substituting Equation (3) into Equation (2), the detection signal Vo is expressed by the following equation:

Eq. 4

$$Vo = \frac{(Crg + Crgl)V2 - Crs(V1 - V2)}{Cag} + V2 \tag{4}$$

If it is assumed that the ratio of the second alternating current voltage V2 to the first alternating current voltage V1 is "K", then the second alternating current voltage V2 is represented by the following equation.

Eq. 5

$$V2 = K \cdot V1 \tag{5}$$

By substituting Equation (5) into Equation (4), the detection signal Vo is expressed by the following equation:

Eq. 6

$$Vo = \frac{(Crg + Crgl)K \cdot V1 - Crs(1-K) \cdot V1}{Cag} + K \cdot V1 \quad (6)$$

Equation (6) is further modified as follows:

Eq. 7

$$Vo = K \cdot V1\left(\frac{Crg + Crgl - Crs\frac{(1-K)}{K}}{Cag} + 1\right) \quad (7)$$

From Equation (7), the conditions under which the components of the parasitic capacitor Crgl contained in the detection signal Vo are deleted are expressed by the following equation:

Eq. 8

$$Crgl = Crs\frac{(1-K)}{K} \quad (8)$$

Equation (8) shows that the components of the parasitic capacitor Crgl included in the detection signal Vo can be deleted by adjusting the ratio K of the second alternating current voltage V2 to the first alternating current voltage V1.

Note that when zero is substituted for the drive current Is and the capacitor Crg in Eq. (3), a relationship similar to Eq. (8) is derived. Accordingly, it can be seen that the components of the parasitic capacitor Crgl included in the detection signal Vo can be deleted by adjusting the ratio K (the amplitude of the second alternating current voltage V2) so that the driving current Is is zero when the object 6 is not in proximity to the detection electrode Es (Crg=0). This is equivalent to adjusting the ratio K (the amplitude of the second alternating current voltage V2) so that the alternating current I2 flowing from the shield electrode Ea to the detection electrode Es via the capacitor Crs and the alternating current I3 flowing from the detection electrode Es to the ground via the parasitic capacitor Crgl are cancelled out.

By substituting Equation (8) into Equation (7), the detection signal Vo is expressed by the following equation:

Eq. 9

$$Vo = K \cdot V1\left(\frac{Crg}{Cag} + 1\right) \quad (9)$$

When the components of the parasitic capacitor Crgl are deleted, as can be seen from Eq. (9), the detection signal Vo is the sum of a component proportional to the capacitor Crg (K*V1*Crg/Cag) and the second alternating current voltage V2 (K*V1). The gain of the detection signal Vo with respect to the first alternating current voltage V1 is proportional to the ratio K, and the smaller the ratio K, the smaller the gain.

The ratio K of the second alternating current voltage V2 to the first alternating current voltage V1 is expressed by the following equation based on the capacitance of the first capacitor Ca and the second capacitor Cb.

Eq. 10

$$K = \frac{Ca}{Ca + Cb} \quad (10)$$

By substituting Equation (10) to Equation (7), the detection signal Vo is expressed by the following equation:

Eq. 11

$$Vo = V1\frac{Ca}{Ca + Cb}\left(\frac{Crg + Crgl - Crs\frac{Cb}{Ca}}{Cag} + 1\right) \quad (11)$$

From Equation (11), the conditions under which the components of the parasitic capacitor Crgl contained in the detection signal Vo are deleted are expressed by the following equation:

Eq. 12

$$Crgl = Crs\frac{Cb}{Ca} \quad (12)$$

Because the capacitance of the capacitor Crs and the capacitance of the first capacitor Ca are constant, it can be seen that the capacitance of the second capacitor Cb is proportional to the capacitance of the parasitic capacitor Crgl when the condition of Eq. (12) is satisfied.

As described above, according to the present embodiment, an alternating current I2 corresponding to the difference between the first alternating current voltage V1 and the second alternating current voltage V2 flows through the capacitor Crs formed between the detection electrode Es and the shield electrode Ea. Because the amplitude of the second alternating current voltage V2 is the amplitude adjusted so that the drive current Is in the absence of the object 6 proximate to the detection electrode Es is zero, the alternating current I2 flowing through the capacitor Crs is approximately equal to the alternating current I3 flowing through the parasitic capacitor Crgl of the detection electrode Es. In other words, the alternating current I2 flowing through the capacitor Crs and the alternating current I3 flowing through the parasitic capacitor Crgl are canceled out. Thus, the drive current Is contains little alternating current due to the parasitic capacitor Crgl. Therefore, the detection signal Vo output from the current output circuit 23 contains little components due to the parasitic capacitor Crgl. Accordingly, even when the parasitic capacitor Crgl is present, the capacitance of the capacitor Crg formed between the object 6 and the detection electrode Es can be accurately detected with high sensitivity.

According to the present embodiment, a voltage obtained by attenuating the first alternating current voltage V1 is output from the second voltage output circuit 22 as the second alternating current voltage V2. By generating the second alternating current voltage V2 using an attenuator that does not include active elements such as a transistor, the noise of the second alternating current voltage V2 is reduced, thereby improving the detection accuracy of the capacitance of the capacitor Crg.

According to the present embodiment, a first alternating current voltage V1 is applied to the series circuit of the first capacitor Ca and the second capacitor Cb, and a second alternating current voltage V2 corresponding to the first alternating current voltage V1 occurs in the second capacitor Cb. This reduces noise compared to the use of a resistive attenuator, thereby increasing the accuracy of detecting the capacitance of the capacitor Crg.

According to the present embodiment, the amplitude of the second alternating current V2 is adjusted by adjusting the capacitance ratio between the first capacitor Ca and the second capacitor Cb, thereby the alternating current I2 flowing through the capacitor Crs and the alternating current I3 flowing through the parasitic capacitor Crgl are canceled out. Therefore, the capacitance of the first capacitor Ca and the capacitance of the second capacitor Cb are not limited by the capacitance of the parasitic capacitor Crgl and can be relatively large values. By increasing the capacitance of the first capacitor Ca and the capacitance of the second capacitor Cb, the accuracy of setting the capacitance ratio can be improved, and the alternating current I2 flowing through the capacitor Crs and the alternating current I3 flowing through the parasitic capacitor Crgl can be precisely canceled out.

According to the present embodiment, the amplitude of the second alternating current V2 is adjusted by adjusting the capacitance value of the second capacitor Cb, thereby the alternating current I2 flowing through the capacitor Crs and the alternating current I3 flowing through the parasitic capacitor Crgl are canceled out. When the alternating currents (I2, I3) canceled out, the capacitance of the second capacitor Cb is proportional to the capacitance of the parasitic capacitor Crgl, as shown in Eq. (12). For example, when the capacitance of the second capacitor Cb is changed for the adjustment, the range of the change is proportional to the range of the capacitance of the parasitic capacitor Crgl in which the alternating currents (I2, I3) are canceled out. Accordingly, the task of adjusting the capacitance of the second capacitor Cb so that the alternating current I2 and the alternating current I3 are cancelled out can be readily performed.

According to the present embodiment, a reference alternating current voltage corresponding to an alternating current voltage output as a detection signal Vo from the operational amplifier OP1 in the absence of an object 6 proximate to the detection electrode Es is subtracted from the detection signal Vo by the subtraction circuit 24. The resulting signal Vm obtained by the subtraction has amplitude that is approximately proportional to the capacitance of the capacitor Crg and becomes very small in the absence of an object 6 proximate to the detection electrode Es. Because the detection signal Vo has large amplitude corresponding to the second alternating current voltage V2 even if the capacitance of the capacitor Crg is zero (Eq. (9)), the subtraction circuit 24 can be provided to increase the dynamic range of the detection signal Vo corresponding to the change in capacitance of the capacitor Crg. Accordingly, the sensitivities for detecting the capacitance of the capacitor Crg can be further enhanced.

According to the present embodiment, because the reference alternating current voltage subtracted from the detected signal Vo in the subtraction circuit 24 is a voltage obtained by attenuating the first alternating current voltage V1, the correlation between the noise component included in the detected signal Vo and the noise component included in the reference alternating current voltage is high. This reduces the noise component of the signal Vm obtained as a result of subtraction of the subtraction circuit 24, thereby increasing the accuracy of detecting the capacitance of the capacitor Crg.

Figure 4:
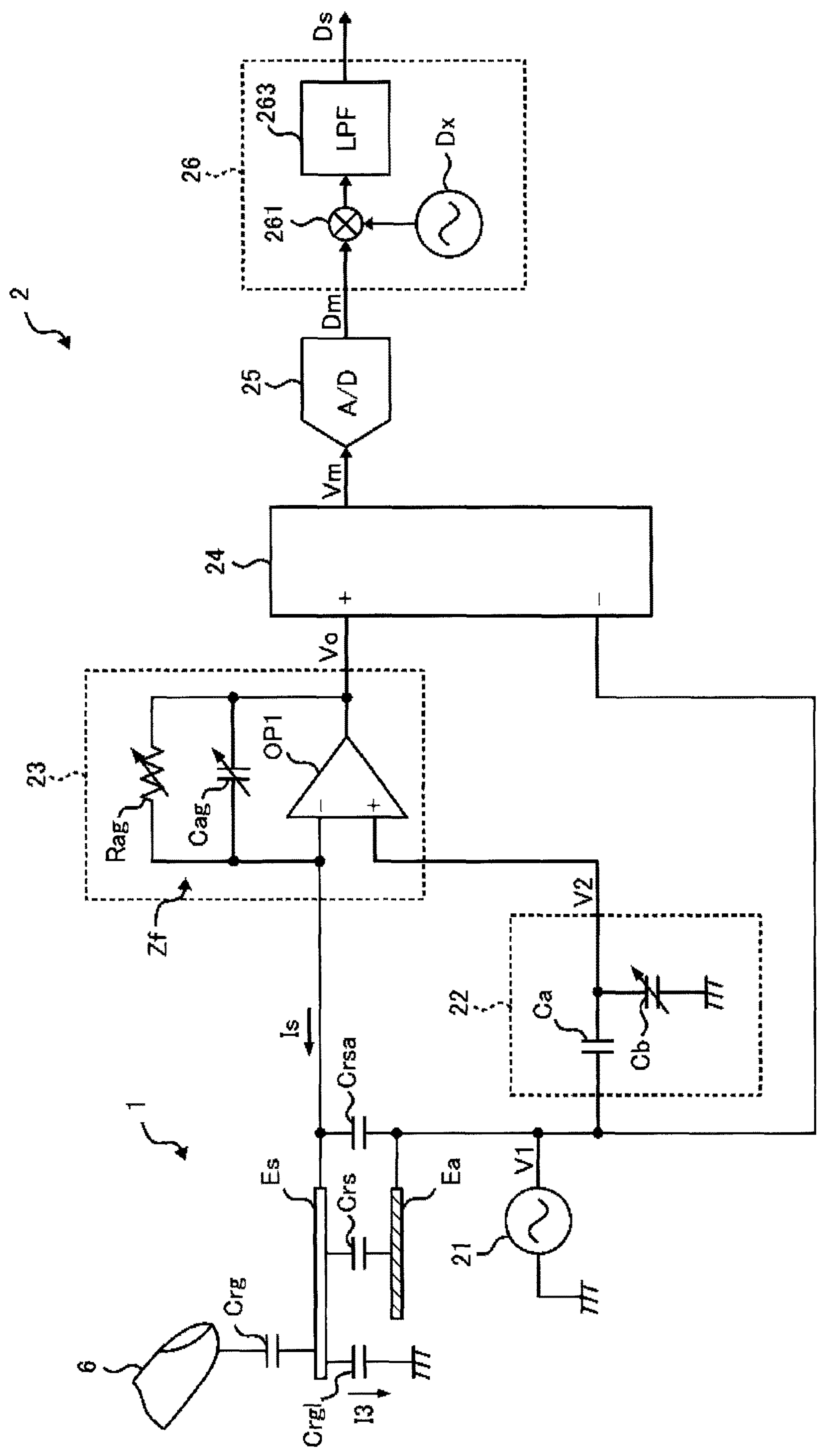
FIG. 4 is a diagram illustrating a modified embodiment of a capacitance detection device.

It should be noted that, in the above-described embodiment, a capacitor Crs (shield electrode side capacitor) formed between the shield electrode Ea and the detection electrode Es is used to cancel the alternating current I3 of the parasitic capacitor Crgl. The capacitance of the capacitor Crs affects the adjustment value of the ratio K of the second alternating current voltage V2 to the first alternating current voltage V1, as shown in Eq. (8). If the capacitance of the parasitic capacitor Crgl is relatively large or the capacitance of the capacitor Crs is relatively small, then the ratio K must be a small value according to Eq. (8). Thus, the gain of the detection signal Vo with respect to the capacitance of the capacitor Crg is decreased. Accordingly, in a modified example of the capacitance detection apparatus 2 illustrated in FIG. 4, in addition to the configuration similar to the capacitance detection apparatus 2 illustrated in FIG. 2, a capacitor Crsa is connected between the detection electrode Es and the shield electrode Ea. Because the capacitor Crsa is connected in parallel with the capacitor Crs, it is substantially equivalent to the increased capacitance value of the capacitor Crs. Accordingly, according to this modified example, even when the capacitance of the parasitic capacitor Crgl is large or the capacitance of the capacitor Crs is small, it is possible to prevent the reduced gain of the detection signal Vo with respect to the capacitance of the capacitor Crg.

Second Embodiment

Figure 5:
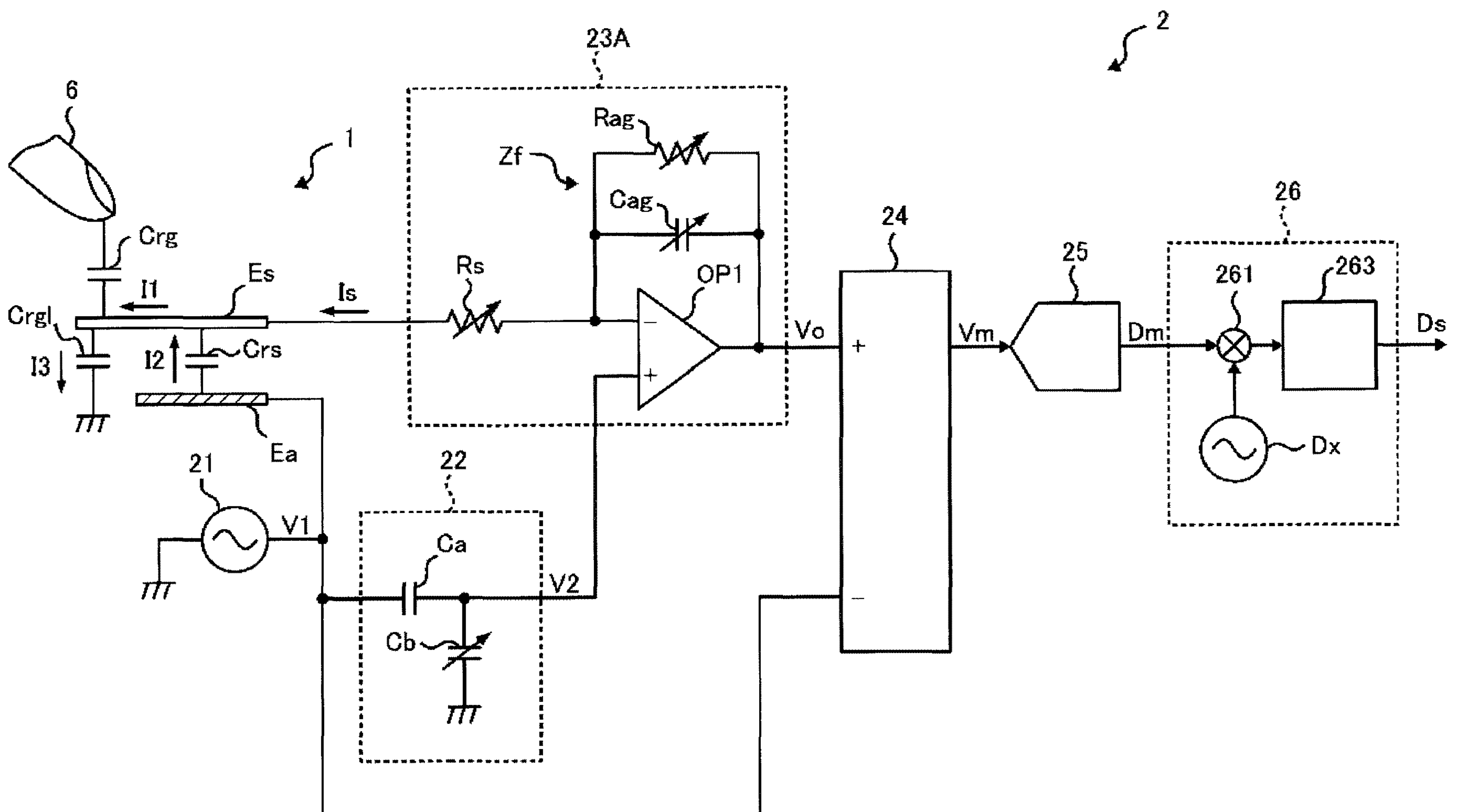
FIG. 5 is a diagram illustrating an example of a structure of a capacitance detection device according to a second embodiment.

Next, a second embodiment of the present invention will be described. FIG. 5 is a diagram illustrating an example of a configuration of a capacitance detection device 2 according to the second embodiment. The overall configuration of the input device including capacitance detection device 2 is the same as in FIG. 1.

In the capacitance detection device 2 illustrated in FIG. 5, the current output circuit 23 in the capacitance detection device 2 illustrated in FIG. 2 is changed to a current output circuit 23A. The current output circuit 23A has the same configuration as the current output circuit 23 in FIG. 2 and further has a first resistor Rs. The first resistor Rs is provided in the path between the inverting input terminal of the operational amplifier OP1 and the detection electrode Es. The first resistor Rs is, for example, a variable resistor, and when the driving frequency of the first alternating current voltage V1 is changed by the control of the processing unit 3, the resistance value of the first resistor Rs is changed according to the driving frequency.

In the capacitance detection device 2 illustrated in FIG. 5, the operational amplifier OP1, the first resistor Rs, and the feedback capacitor Cag of the current output circuit 23A constitute (form) a low pass filter for a signal input from the object 6 via the capacitor Crg. Therefore, even if an alternating current noise voltage is superimposed between the ground to which the object 6 is grounded and the ground of the capacitance detector 2, the noise voltage is attenuated by a low pass filter of the current output circuit 23A.

Figure 6:
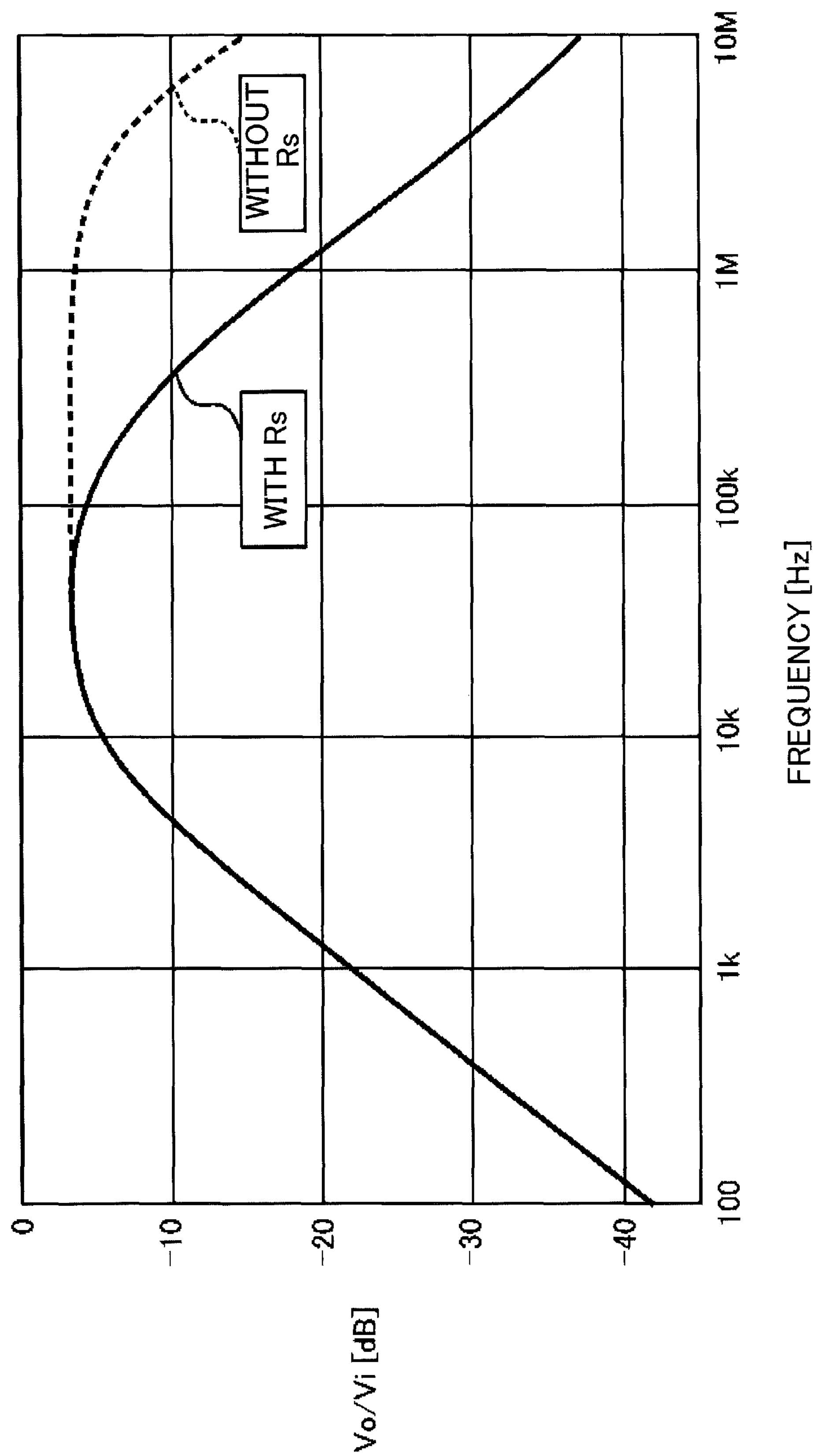
FIG. 6 is a diagram illustrating a difference in frequency characteristics according to the presence or absence of a first resistor.

FIG. 6 is a diagram illustrating the result of simulating the frequency characteristics of the gain of the detection signal Vo with respect to a voltage Vi input from the object 6, and shows the difference in the frequency characteristics according to the presence or absence of the first resistor Rs. In an example of FIG. 6, it can be seen that providing the first resistor Rs reduces the gain at frequencies greater than 100 kHz and effectively functions as a low pass filter.

The gain G of the detection signal Vo with respect to the capacitance of the capacitor Crg is expressed by the following equation:

Eq. 13

$$G = \frac{\partial Vo}{\partial Crg} = \frac{\frac{1}{Cag}}{(1 + s \cdot Crgt \cdot Rs) \cdot \left(\frac{1}{s \cdot Cag \cdot Rag} + 1\right)} \cdot V2 \tag{13}$$

In Equation (13), "Crgt" represents the sum of "Crg", "Crgl" and "Crs", and "s" represents the complex number. Equation (13) can be further modified as follows:

Eq. 14

$$G = \frac{\frac{1}{Cag}}{1 + s \cdot Crgt \cdot Rs + \frac{1}{s \cdot Cag \cdot Rag} + \frac{Crgt \cdot Rs}{Cag \cdot Rag}} \cdot V2 \tag{14}$$

In Eq. (14) where the complex number "s" is changed to the imaginary number "jω", when the condition that the imaginary term of the denominator is zero is met the gain G is maximized and the phase shift between the second alternating current voltage V2 and the detection signal Vo becomes zero. The resistance value of the feedback resistor Rag and the capacitance value of the feedback capacitor Cag are adjusted so that this condition is met. If this condition is met, the gain G is given by the following equation:

Eq. 15

$$G = \frac{\frac{1}{Cag}}{1 + \frac{Crgt \cdot Rs}{Cag \cdot Rag}} \cdot V2 \tag{15}$$

As described above, according to the present embodiment, because external noise input through the object 6 can be attenuated, it is possible to suppress the deterioration of the detection accuracy of the capacitance due to the external noise.

According to the present embodiment, because the resistance value of the first resistance Rs is changed according to the driving frequency of the first alternating current voltage V1, the cut-off frequency of the low-pass filter (OP1, Rs, Cag) can be set to an appropriate frequency corresponding to the driving frequency of the first alternating current voltage V1, and the noise from the object 6 can be further effectively attenuated.

According to the present embodiment, by adjusting the resistance value of the feedback resistor Rag and the capacitance value of the feedback capacitor Cag, the phase difference between the first and second alternating current voltages (V1 and V2) and the detection signal (Vo) can be appropriately set, and the gain G of the detection signal Vo with respect to the capacitance of the capacitor Crg can be appropriately set.

Third Embodiment

Figure 7:
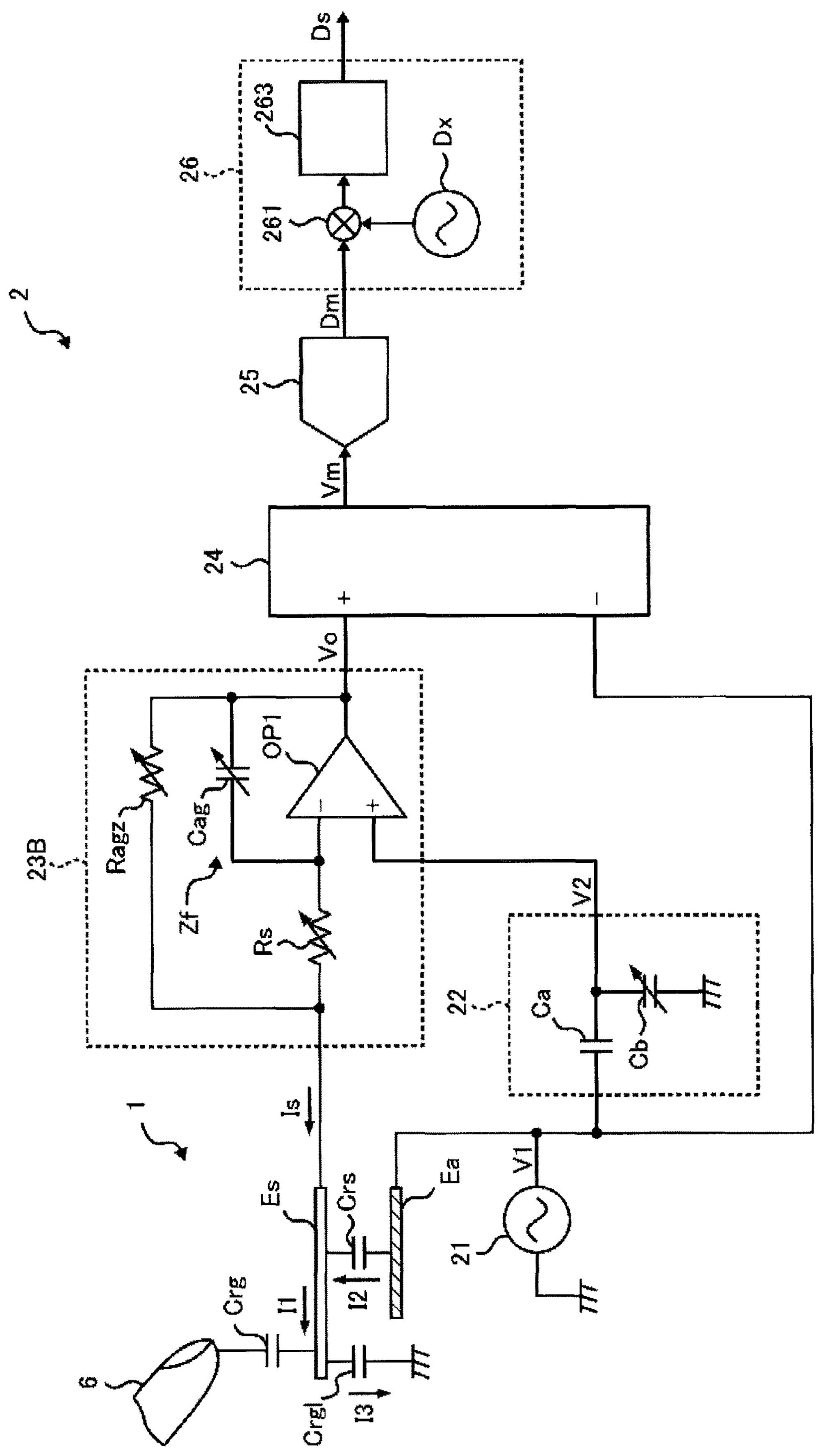
FIG. 7 is a diagram illustrating an example of a structure of a capacitance detection device according to a third embodiment.

Next, a third embodiment of the present invention will be described. FIG. 7 is a diagram illustrating an example of a configuration of a capacitance detection device 2 according to the third embodiment. The overall configuration of the input device including the capacitance detection device 2 is the same as in FIG. 1.

In the capacitance detection device 2 illustrated in FIG. 7, the current output circuit 23 in the capacitance detection device 2 illustrated in FIG. 2 is changed to a current output circuit 23B. In the current output circuit 23B, the feedback resistor Rag in the current output circuit 23A of the second embodiment described above is replaced with a feedback resistor Ragz, and the remaining configuration is the same as the current output circuit 23A. The feedback resistor Ragz is provided in the path between one end of the first resistor Rs connected to the detection electrode Es and the output terminal of the operational amplifier OP1.

In the capacitance detection device 2 illustrated in FIG. 7, the operational amplifier OP1, the first resistor Rs, the feedback resistor Ragz, and the feedback capacitor Cag of the current output circuit 23B constitute (form) a low pass filter for a signal input from the object 6 via the capacitor Crg. The low pass filter (OP1, Rs, Cag) included in the current output circuit 23A of FIG. 5 is a filter having a pole of a real number, whereas the low pass filter (OP1, Rs, Ragz, Cag) included in the current output circuit 23B of FIG. 7 is a filter having a pole of a complex number.

Figure 8:
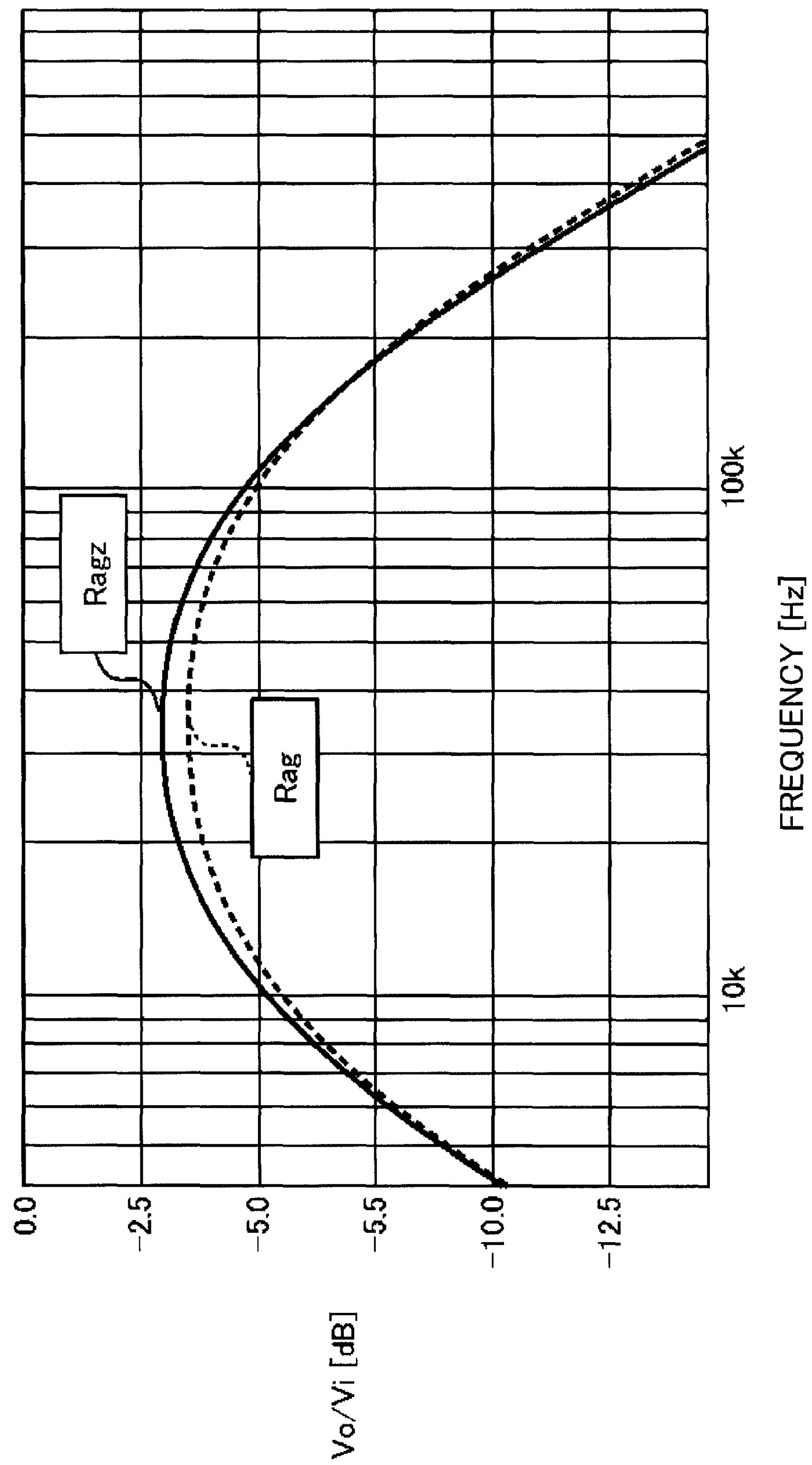
FIG. 8 is a diagram illustrating the difference in frequency characteristics between the capacitance detection device of FIG. 5 and the capacitance detection device of FIG. 7.

FIG. 8 is a diagram illustrating the result of simulating the frequency characteristics of the gain of the detection signal Vo with respect to the voltage Vi input from the object 6, and shows the difference in frequency characteristics between the capacitance detection device 2 in FIG. 5 and the capacitance detection device 2 in FIG. 7. The frequency characteristics of the capacitance detection device 2 in FIG. 7 (solid line) has a higher peak gain than the frequency characteristics (dotted line) of the capacitance detection device 2 in FIG. 5.

As described above, according to the present embodiment, the pole of the transfer function of the gain of the low-pass filter (OP1, Rs, Ragz, Cag) is a complex pole, and the gain is higher at the frequency near the pole, and thus, the detection sensitivity can be further increased.

Fourth Embodiment

Figure 9:
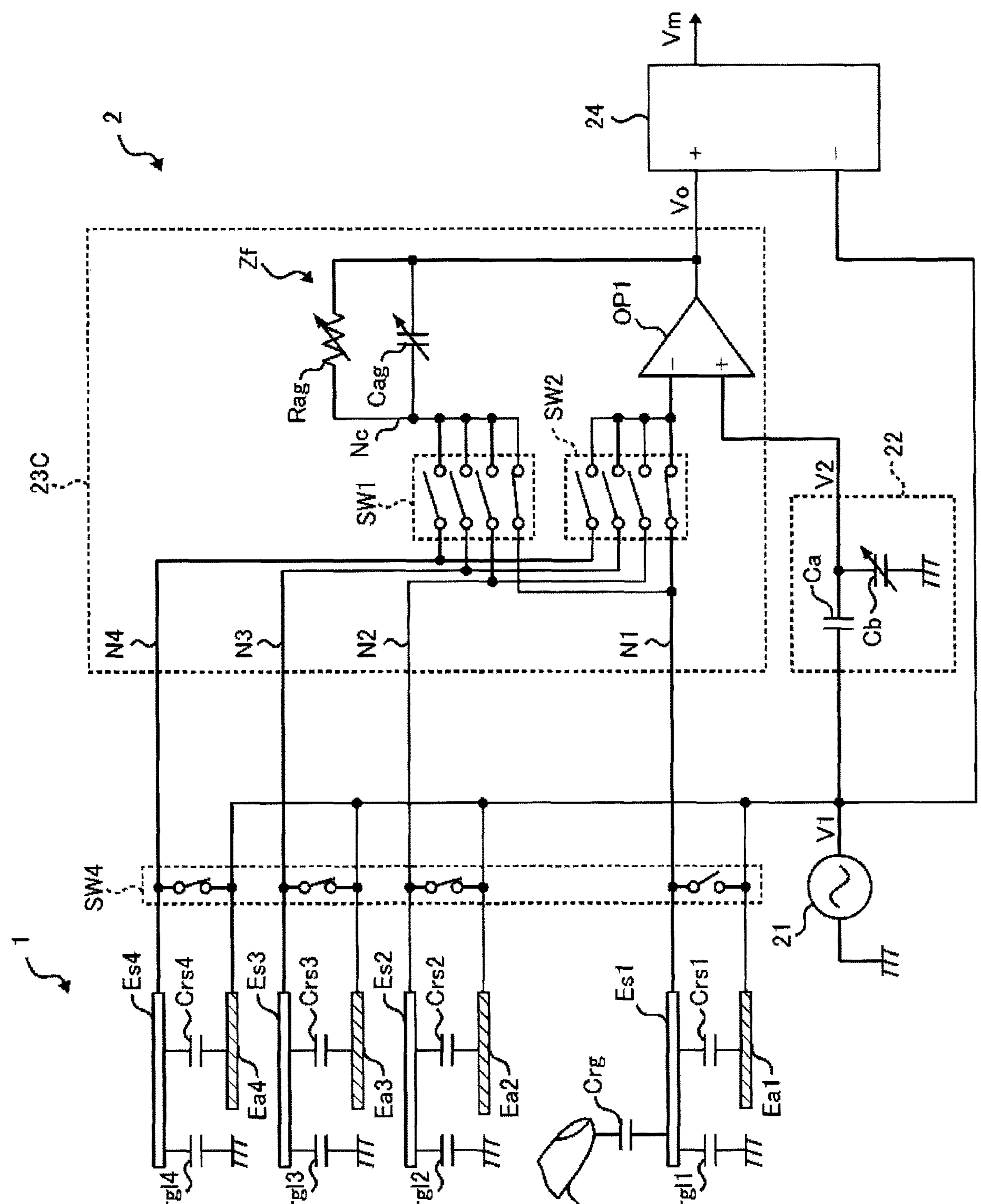
FIG. 9 is a diagram illustrating an example of a structure of a capacitance detection device according to a fourth embodiment.

Next, a fourth embodiment of the present invention will be described. FIG. 9 is a diagram illustrating an example of a configuration of a capacitance detection device 2 according to the fourth embodiment. The overall configuration of the input device including the capacitance detection device 2 is the same as in FIG. 1.

In an example of FIG. 9, the sensor unit 1 includes a plurality of detection electrodes (Es1 to Es4) and shield electrodes (Ea1 to Ea4) that serve as electrostatic shields for the detection electrodes Es1 to Es4. The detection electrodes Es1 to Es4 are each supplied with the drive current Is from the capacitance detection device 2 described later. A common first alternating current voltage V1 is applied to the shield electrodes Ea1 to Ea4. It should be noted that, in the example of FIG. 9, the shield electrodes Ea1-Ea4 are separately provided for corresponding detection electrodes, but at least a portion of the shield electrodes may be provided in common. Further, the number of detection electrodes is not limited to 4 and may be 3 or less or 5 or more.

The capacitance detection device 2 detects the capacitance with respect to each of the detection electrodes Es1-Es4. The capacitance detection device 2 illustrated in FIG. 9 has a configuration similar to the capacitance detection device 2 described above (first voltage output circuit 21, second voltage output circuit 22, subtraction circuit 24) and has a current output circuit 23C.

The current output circuit 23C includes an operational amplifier OP1, a feedback circuit Zf, a first switch circuit SW1, a second switch circuit SW2, and a fourth switch circuit SW4. The feedback circuit Zf includes a feedback resistor Rag and a feedback capacitor Cag connected in parallel.

The operational amplifier OP1 amplifies the voltage difference between the inverting input terminal connected to any of the detection electrodes Es1 to Es4 via the second switch circuit SW2 and the non-inverting input terminal to which the second alternating voltage V2 is applied, and outputs the amplification result as the detection signal Vo. The feedback circuit Zf is provided in the path between the output terminal of the detection signal Vo of the operational amplifier OP1 and a common node Nc. The first switch circuit SW1 selects one input node from a plurality of input nodes N1 to N4 and connects it to the common node Nc. The second switch circuit SW2 selects the same input node selected by the first switch circuit SW1 from a plurality of the input nodes N1 to N4 and connects it to the inverting input terminal of the operational amplifier OP1. The input node Ni (i is an integer from 1 to 4) is connected to the detection electrode Esi.

The fourth switch circuit SW4 selects input nodes that are not selected by the first switch circuit SW1 and the second switch circuit SW2 from a plurality of input nodes N1 to N4 and applies the first alternating current voltage V1 to the selected input nodes. In other words, the fourth switch circuit SW4 applies the same first alternating current voltage V1 as is applied to the shield electrodes Ea1 to Ea4 to the detection electrodes for which capacitance detection is not performed. This reduces the effect of parasitic capacitors formed between the detection electrodes for which capacitance detection is not performed and the detection electrode for which capacitance detection is performed and improves the detection sensitivity and detection accuracy of capacitance because no current flows through the parasitic capacitors formed between the detection electrodes for which capacitance detection is not performed and the detection electrode for which capacitance detection is performed.

When the capacitance detection for the detection electrode Esi is performed, the first switch circuit SW1 selects the input node Ni and connects it to the common node Nc, and the second switch circuit SW2 selects the input node Ni and connects it to the inverting input terminal of the operational amplifier OP1. Thus, the configuration of the current output circuit 23C viewed from the detection electrode Esi is equivalent to that of the current output circuit 23 of FIG. 2. Accordingly, the detection signal Vo is generated by the same operation as the capacitance detection device 2 illustrated in FIG. 2.

In this embodiment, each switch included in the switch circuits (SW1, SW2) is formed by an active element such as a MOS transistor. Switches with active elements (analog switches) have a non-linearity in which the conduction resistance varies with the signal level. Therefore, as the voltage drop due to the conduction resistance of the switch increases, the non-linearity effect of the conduction resistance causes the distortion of the signal passing through the switch to increase. If a switch is provided between the input node Ni and the detection electrode Esi, because the capacitor Crs has a relatively large capacitance (due to the relatively small impedance of the capacitor Crs), the distortion of the detection signal Vo due to the non-linearity of the switch is likely to appear. On the other hand, in this embodiment, the switches of the first switch circuit SW1 and the second switch circuit SW2 are provided in the feedback loop between the inverting input terminal of the operational amplifier OP1 and the output terminal. The capacitance of the feedback capacitor Cag of the feedback circuit Zf is sufficiently small compared to the capacitance of the capacitor Crs (e.g., about one tenth of the capacitor Crs). Therefore, the non-linearity of the switch included in the first switch circuit SW1 is less likely to cause distortion of the detection signal Vo than when the switch is provided outside the feedback loop (when the switch is provided in the path between the input node Ni and the detection electrode Esi). Also, because the impedance of the inverting input terminal of the operational amplifier OP1 is very high, the non-linearity of the switches of the second switch circuit SW2 provided between the input node Ni and the inverting input terminal has little effect. Accordingly, according to the present embodiment, the distortion of the detection signal Vo due to the effect of the non-linearity of the switches included in the switch circuits (SW1, SW2) can be effectively reduced.

Figure 10A:
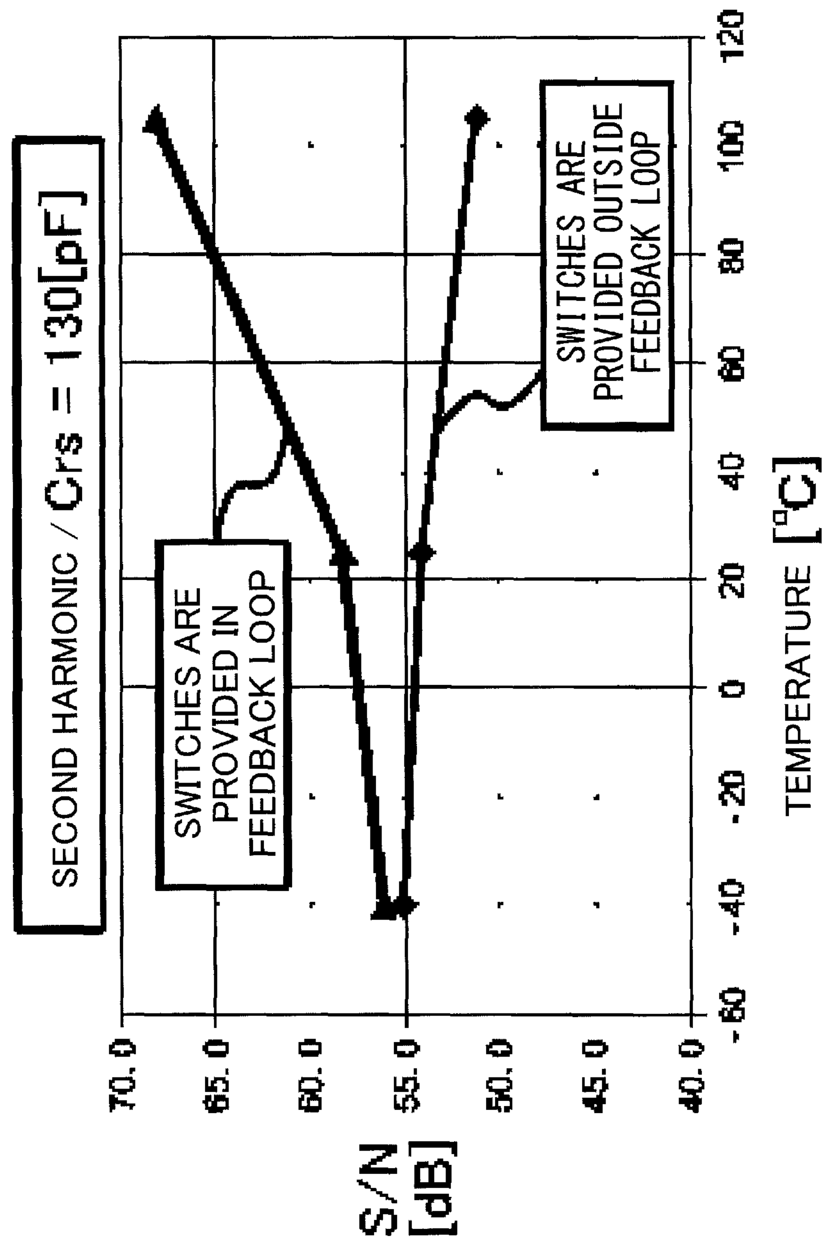
FIG. 10A is a drawing illustrating simulated results of disturbance resistance against disturbance.
Figure 10B:
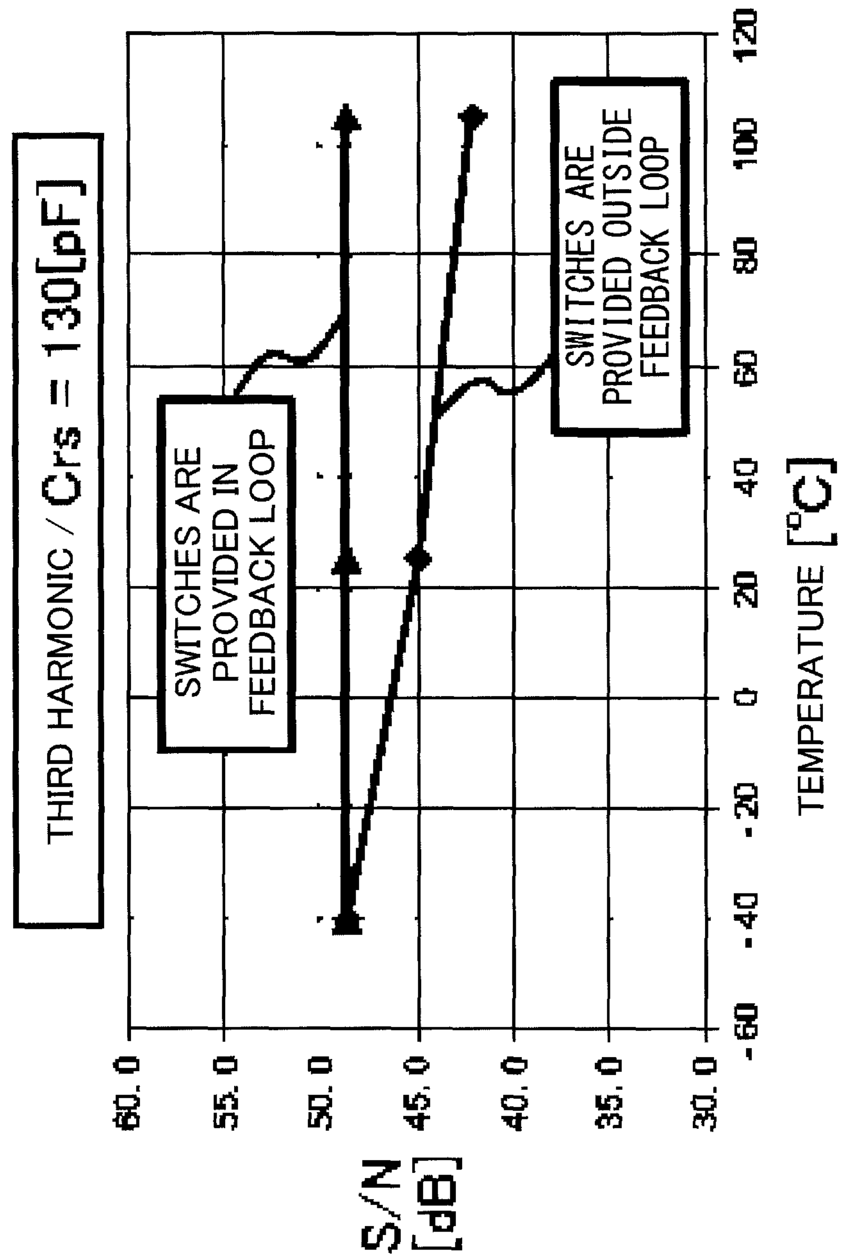
FIG. 10B is a drawing illustrating simulated results of disturbance resistance against disturbance.
Figure 10C:
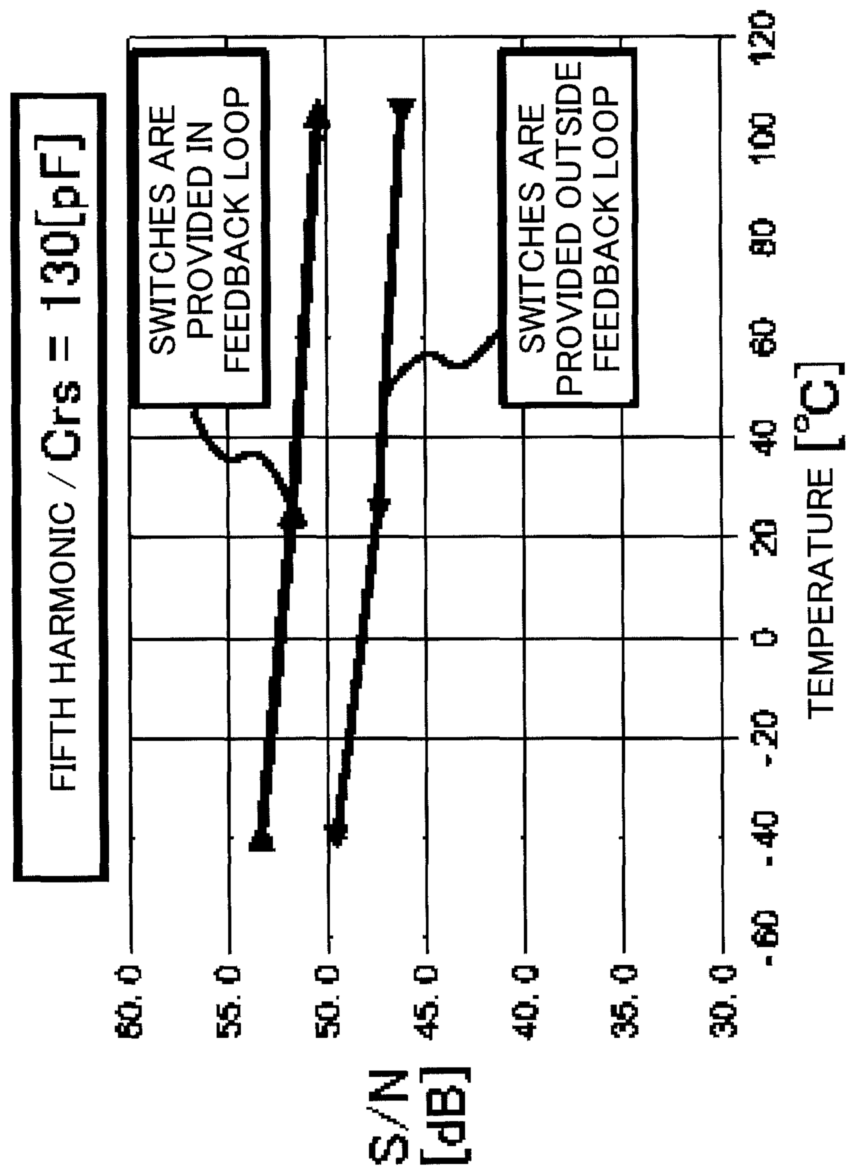
FIG. 10C is a drawing illustrating simulated results of disturbance resistance against disturbance.
Figure 10D:
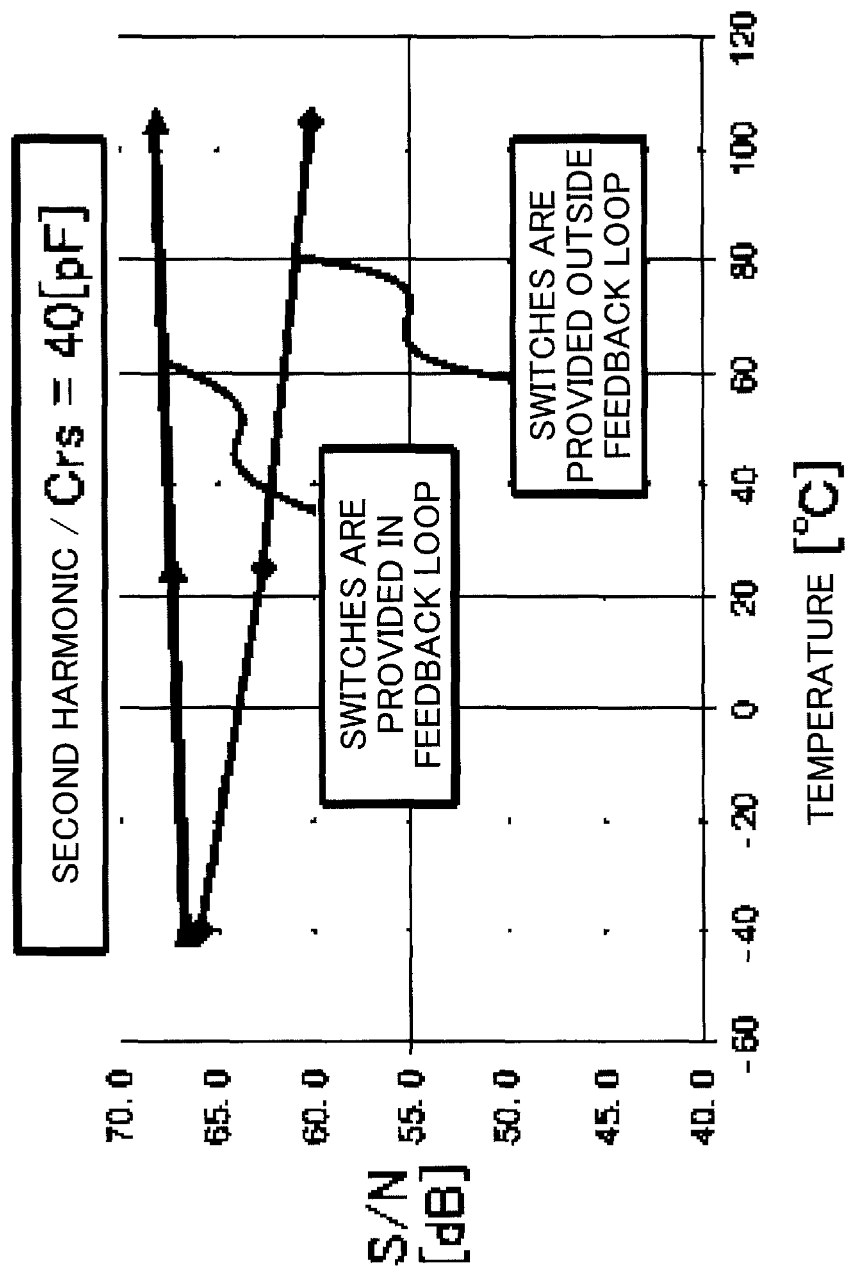
FIG. 10D is a drawing illustrating simulated results of disturbance resistance against disturbance.
Figure 10E:
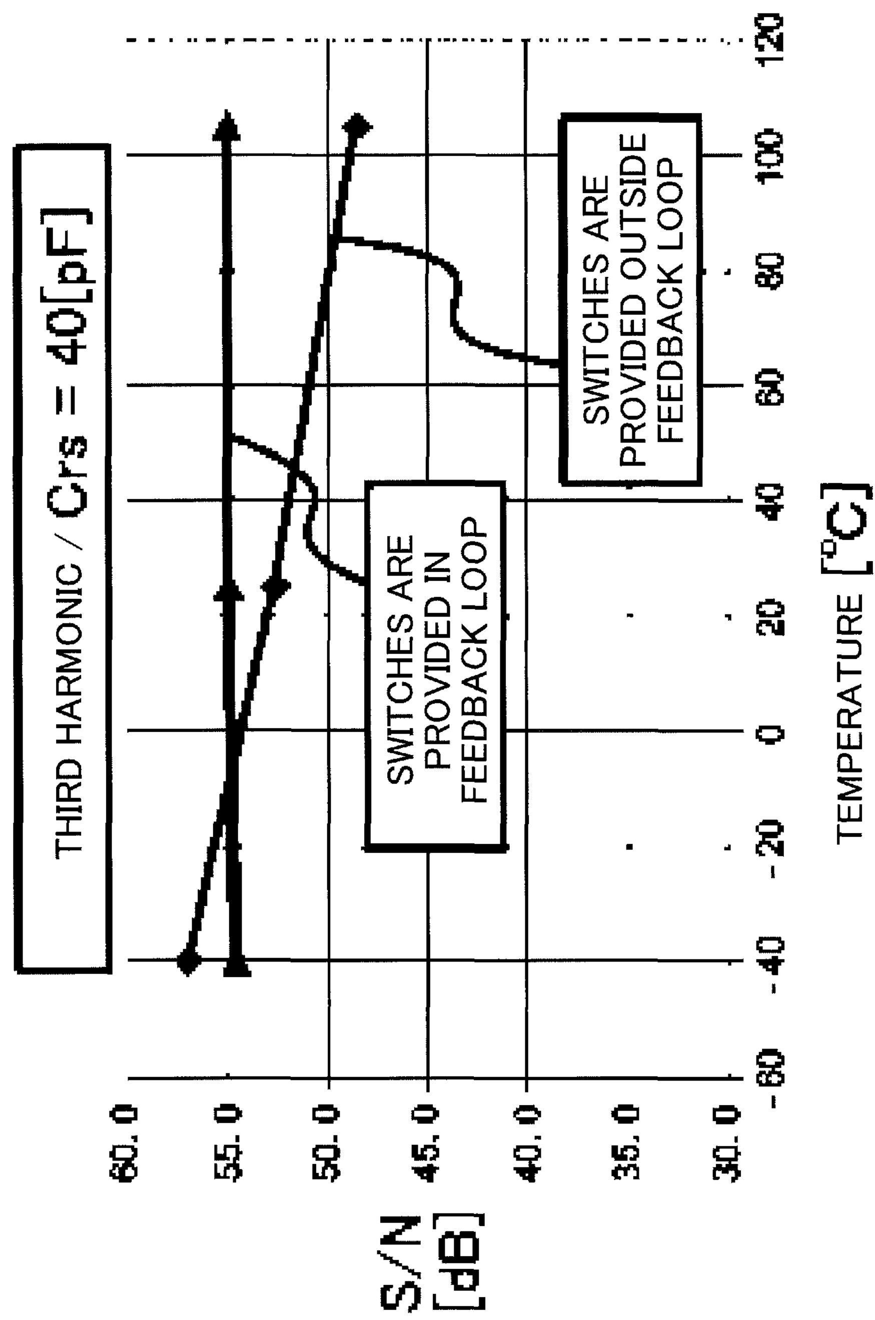
FIG. 10E is a drawing illustrating simulated results of disturbance resistance against disturbance.
Figure 10F:
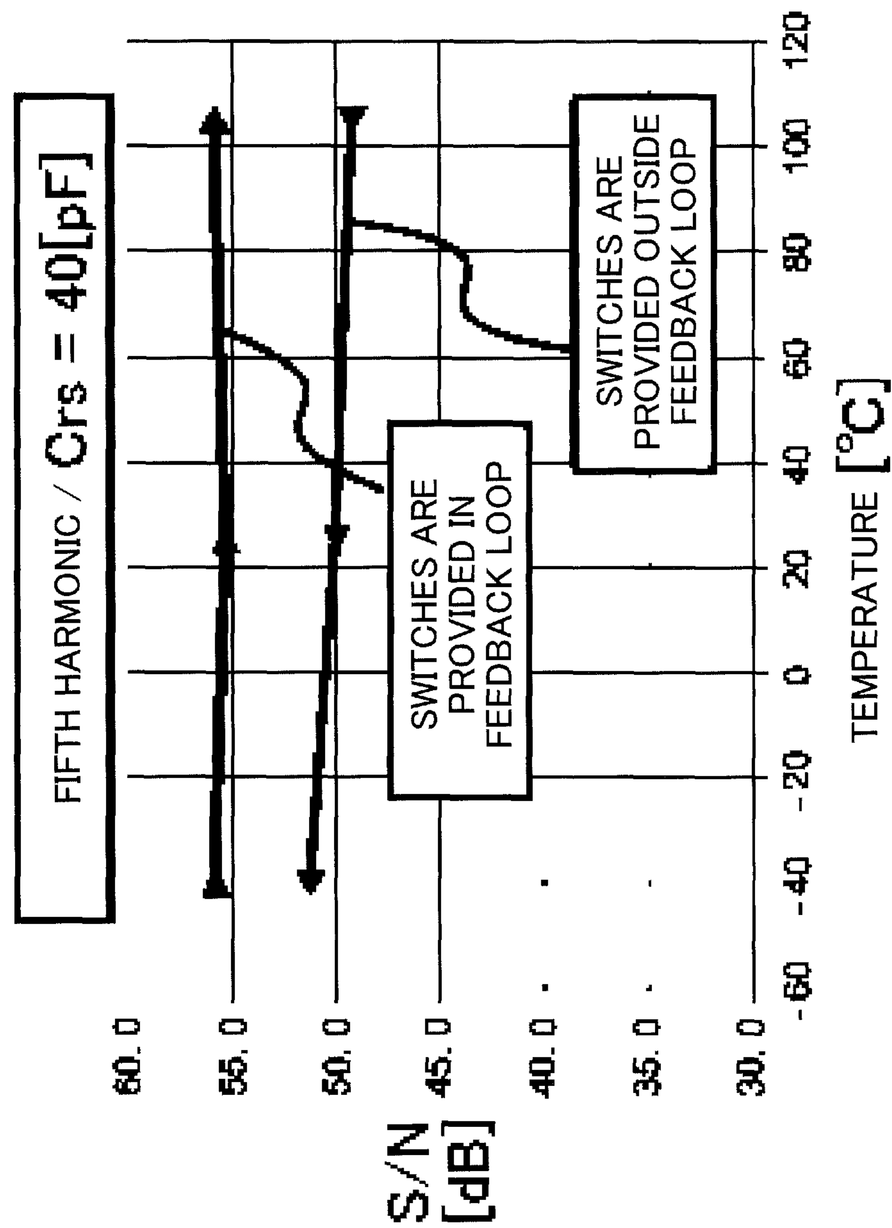
FIG. 10F is a drawing illustrating simulated results of disturbance resistance against disturbance.

FIGS. 10A-10F are diagrams illustrating simulation results of disturbance resistance against the disturbance. In each graph of FIGS. 10A-10F, the vertical axis represents the SN ratio and the horizontal axis represents the temperature. The SN ratio is the ratio of the detection signal Vo when noise is applied to the detection electrode via the capacitor Crg to the detection signal Vo when noise is zero. In the simulation of FIGS. 10A-10C, the capacitance of the capacitor Crs is 130 pF, and in the simulation of FIGS. 10D-10F, the capacitance of the capacitor Crs is 40 pF. In the simulation of FIGS. 10A and 10D, the frequency of noise is twice the driving frequency, in the simulation of FIGS. 10B and 10E, the frequency of noise is three times the driving frequency, and in the simulation of FIGS. 10C and 10F, the frequency of noise is five times the driving frequency. From these simulations, it can be seen that, by providing the switches included in the switch circuits (SW1 and SW2) in the feedback loop (the path between the output terminal of the operational amplifier OP1 and the inverting input terminal), the SN ratio at room temperature (20 □C) is improved by about 5 dB compared to the case where the switches are provided outside the feedback loop (the path between the input node Ni and the detection electrode Esi).

Fifth Embodiment

Figure 11:
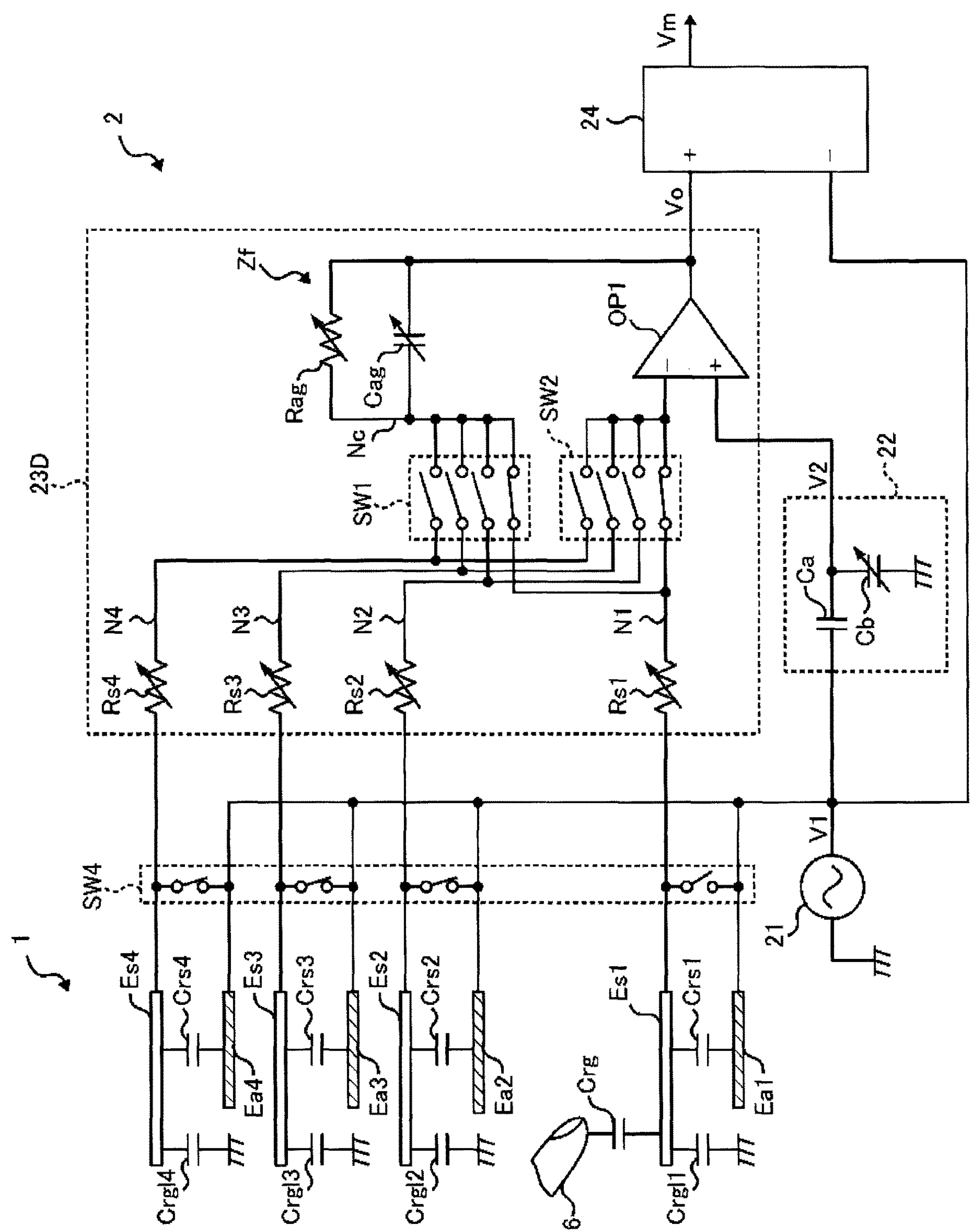
FIG. 11 is a diagram illustrating an example of a structure of a capacitance detection device according to a fifth embodiment.

Next, a fifth embodiment of the present invention will be described. FIG. 11 is a diagram illustrating an example of a configuration of a capacitance detection device 2 according to the fifth embodiment. The overall configuration of the input device including the capacitance detection device 2 is the same as in FIG. 1.

In the capacitance detection device 2 illustrated in FIG. 11, the current output circuit 23C of the capacitance detection apparatus 2 illustrated in FIG. 9 is changed to the current output circuit 23D. The current output circuit 23D has first resistors Rs1 to Rs4 in addition to the same configuration as the current output circuit 23C (FIG. 9) of the fourth embodiment described above. The first resistor Rsi is provided in the path between the detection electrode Esi and the input node Ni. The first resistor Rsi is, for example, a variable resistor, and when the driving frequency of the first alternating current voltage V1 is changed by the control of the processing unit 3, the resistance value of the first resistor Rsi is changed according to the driving frequency.

In the capacitance detection device 2 shown in FIG. 11, when the capacitance of the detection electrode Esi is detected (when the input node Ni is selected by the first switch circuit SW1 and by the second switch circuit SW2), the configuration of the current output circuit 23D viewed from the detection electrode Esi is equivalent to the current output circuit 23A shown in FIG. 5. Accordingly, similar to the capacitance detection device 2 illustrated in FIG. 5, the external noise input through the object 6 can be attenuated.

Sixth Embodiment

Figure 12:
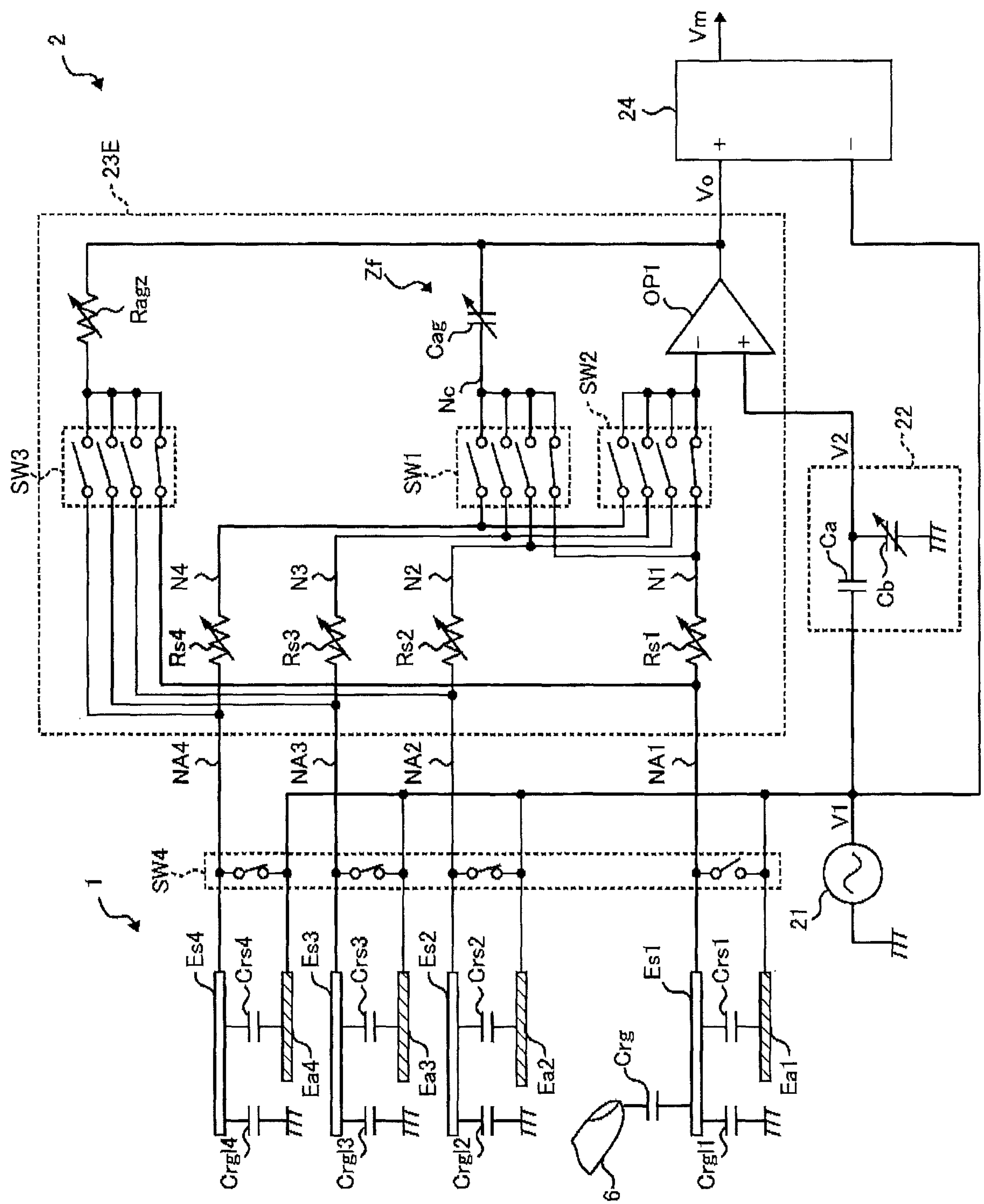
FIG. 12 is a diagram illustrating an example of a structure of a capacitance detection device according to a sixth embodiment.

Next, a sixth embodiment of the present invention will be described. FIG. 12 is a diagram illustrating an example of a configuration of a capacitance detecting device 2 according to the sixth embodiment. The overall configuration of the input device including the capacitance detection device 2 is the same as in FIG. 1.

In the capacitance detection device 2 illustrated in FIG. 12, the current output circuit 23D of the capacitance detection device 2 illustrated in FIG. 11 is changed to the current output circuit 23E. In the current output circuit 23E, the third switch circuit SW3 is added to the current output circuit 23D (FIG. 11) of the fifth embodiment described above, and the feedback resistor Rag is changed to the feedback resistor Ragz, and the remaining configuration is the same as the current output circuit 23D.

The third switch circuit SW3 selects one connection node NAi (i is an integer of 1 to 4) from a plurality of connection nodes (NA1 to NA4) and connects the connection node NAi to the output terminal of the operational amplifier OP1 via a feedback resistor Ragz. It should be noted that the connection node NAi is a node that connects the first resistor Rsi to the detection electrode Esi. When the third switch circuit SW3 selects the connection node NAi, the first switch circuit SW1 and the second switch circuit SW2 select the input node Ni.

The feedback resistor Ragz is provided in the path between the third switch circuit SW3 and the output terminal of the operational amplifier OP1. One terminal of the feedback resistor Ragz is connected to the third switch circuit SW3 and the other terminal is connected to the output terminal of the operational amplifier OP1.

In the capacitance detection device 2 shown in FIG. 12, when the capacitance of the detection electrode Esi is detected (when the input node Ni is selected by the first switch circuit SW1 and by the second switch circuit SW2 and the connection node NAi is selected by the third switch circuit SW3), the configuration of the current output circuit 23D viewed from the detection electrode Esi is equivalent to the current output circuit 23B shown in FIG. 7. Accordingly, as in the capacitance detection device 2 illustrated in FIG. 7, the gain of the low pass filter is increased, thereby improving the sensitivity of detecting the capacitance.

The present invention is not limited to the embodiments described above, but includes various variations.

For example, in the embodiments described above (e.g., FIG. 2), a parallel circuit of a feedback capacitor (Cag) and a feedback resistor (Rag) is used as a feedback circuit of an operational amplifier in the current output circuit, but the present invention is not limited thereto. In other embodiments of the present invention, only a feedback resistor may be used as the feedback circuit, or only a feedback capacitor may be used as the feedback circuit.

In the embodiments described above, the operational amplifier (OP1) outputs a drive current (Is) from the operational amplifier (OP1) and outputs a voltage detection signal (Vo) from the operational amplifier (OP1) via a feedback circuit (Zf) provided in the feedback loop of the operational amplifier (OP1), but the present invention is not limited to this example. For example, the current output circuit may include a current output part that outputs a current proportional to the drive current, and a current-voltage conversion part that converts the output current into a voltage and outputs the voltage as a voltage detection signal.

The input device of the present invention is not limited to a user interface device which is used for inputting operational information of a finger, or the like. In other words, the input device of the present invention is broadly applicable to devices that are used for inputting information in accordance with the capacitance of the detection electrode that varies with the proximity of various objects not limited to the human body.

DESCRIPTION OF THE REFERENCE NUMERALS

1 . . . sensor unit,
2 . . . capacitance detection device,
3 . . . processing unit,
4 . . . storage unit,
5 . . . interface unit,
6 . . . object,
21 . . . first voltage output circuit,
22 . . . second voltage output circuit,
23, 23A-23E . . . current output circuit,
24 . . . subtraction circuit,
241 . . . fully-differential amplifier,
25 . . . A/D converter,
26 . . . signal processing unit,
261 . . . multiplier,
263 . . . low pass filter,
SW1 . . . first switch circuit
SW2 . . . 2nd switch circuit,
SW3 . . . 3rd switch circuit,
SW4 . . . 4th switch circuit,
OP1 . . . operational amplifier,
Zf . . . feedback circuit,
Rag . . . feedback resistor,
Cag . . . feedback capacitor,
Rs, Rs1-Rs4 . . . first resistor,
Ca . . . first capacitor,
Cb . . . second capacitor,
Crgl . . . parasitic capacitor,
Es, Es1-Es4 . . . detection electrode,
Ea, Ea1-Ea4 . . . shield electrode,
V1 . . . first alternating current voltage,
V2 . . . second alternating current voltage,
Is . . . drive current,
Vo . . . detection signal,
N1-N4 . . . input node,
NA1-NA4 . . . connection node

What is claimed is:

1. A capacitance detection device for detecting a capacitance between an object proximate to a detection electrode and the detection electrode, the capacitance detection device comprising:

a first voltage output circuit configured to output a first alternating current voltage supplied to a shield electrode disposed proximate to the detection electrode;

a second voltage output circuit configured to output a second alternating current voltage, frequency and phase of the second alternating current voltage being equal to those of the first alternating current voltage and amplitude of the second alternating current voltage being less than that of the first alternating current voltage; and a current output circuit configured to output a drive current to the detection electrode so that a voltage difference between a voltage of the detection electrode and the second alternating current voltage is reduced, and output a detection signal corresponding to the drive current, wherein the second voltage output circuit outputs the second alternating current voltage with amplitude adjusted so that the drive current becomes zero in the absence of the object proximate to the detection electrode, wherein the second voltage output circuit outputs a voltage obtained by attenuating the first alternating current voltage as the second alternating current voltage, wherein the second voltage output circuit includes a series circuit of a first capacitor and a second capacitor, the first voltage output circuit applies the first alternating current voltage to both ends of the series circuit, and the second alternating current voltage is generated in accordance with the first alternating current voltage in the second capacitor.

2. The capacitance detection device according to claim 1, wherein a capacitance ratio of the first capacitor to the second capacitor has a value adjusted so that the driving current in the absence of the object proximate to the detection electrode is zero.

3. The capacitance detection device according to claim 2, wherein a capacitance value of the second capacitor is adjustable, and the second capacitor has the capacitance value adjusted so that the driving current in the absence of the object proximate to the detection electrode is zero.

4. An input device used for inputting information according to the proximity of the object, the input device comprising:

at least one detection electrode, the capacitance between the detection electrode and the object changing according to the proximity of the object;

a shield electrode provided in proximity to the detection electrode; and the capacitance detection device for detecting the capacitance between the object and the detection electrode according to claim 1.

5. A capacitance detection device for detecting a capacitance between an object proximate to a detection electrode and the detection electrode, the capacitance detection device comprising:

a first voltage output circuit configured to output a first alternating current voltage supplied to a shield electrode disposed proximate to the detection electrode;

a second voltage output circuit configured to output a second alternating current voltage, frequency and phase of the second alternating current voltage being equal to those of the first alternating current voltage and amplitude of the second alternating current voltage being less than that of the first alternating current voltage; and a current output circuit configured to output a drive current to the detection electrode so that a voltage difference between a voltage of the detection electrode and the second alternating current voltage is reduced, and output a detection signal corresponding to the drive current, wherein the second voltage output circuit outputs the second alternating current voltage with amplitude adjusted so that the drive current becomes zero in the absence of the object proximate to the detection electrode, wherein the current output circuit includes an operational amplifier for amplifying a voltage difference between an inverting input terminal connected to the detection electrode and a non-inverting input terminal to which the second alternating current voltage is applied, and outputting the amplified result as the detection signal, a feedback capacitor provided in a path between an output terminal of the detection signal of the operational amplifier and the inverting input terminal, a feedback resistor connected in parallel with the feedback capacitor, and a first resistor provided in a path between the inverting input terminal of the operational amplifier and the detection electrode.

6. The capacitance detection device according to claim 5, wherein the first voltage output circuit and the second voltage output circuit are each enabled to change the frequency of an output alternating current voltage, and the first resistor is a variable resistor whose resistance value is changed according to the frequency of the first alternating current voltage and the second alternating current voltage.

7. The capacitance detection device according to claim 5, wherein a capacitance value of the feedback capacitor and a resistance value of the feedback resistor are adjustable, respectively.

8. An input device used for inputting information according to the proximity of the object, the input device comprising:

at least one detection electrode, the capacitance between the detection electrode and the object changing according to the proximity of the object;

a shield electrode provided in proximity to the detection electrode; and the capacitance detection device for detecting the capacitance between the object and the detection electrode according to claim 5.

9. A capacitance detection device for detecting a capacitance between an object proximate to a detection electrode and the detection electrode, the capacitance detection device comprising:

a first voltage output circuit configured to output a first alternating current voltage supplied to a shield electrode disposed proximate to the detection electrode;

a second voltage output circuit configured to output a second alternating current voltage, frequency and phase of the second alternating current voltage being equal to those of the first alternating current voltage and amplitude of the second alternating current voltage being less than that of the first alternating current voltage; and a current output circuit configured to output a drive current to the detection electrode so that a voltage difference between a voltage of the detection electrode and the second alternating current voltage is reduced, and output a detection signal corresponding to the drive current, wherein the second voltage output circuit outputs the second alternating current voltage with amplitude adjusted so that the drive current becomes zero in the absence of the object proximate to the detection electrode, wherein the current output circuit includes an operational amplifier for amplifying a voltage difference between an inverting input terminal connected to the detection electrode and a non-inverting input terminal to which the second alternating current voltage is applied, and for outputting the amplified result as the detection signal, a feedback capacitor provided in a path between an output terminal of the detection signal of the operational amplifier and the inverting input terminal, a first resistor provided in a path between the inverting input terminal of the operational amplifier and the detection electrode, and a feedback resistor provided in a path between one end of the first resistor connected to the detection electrode and the output terminal of the operational amplifier.

10. An input device used for inputting information according to the proximity of the object, the input device comprising:

at least one detection electrode, the capacitance between the detection electrode and the object changing according to the proximity of the object;

a shield electrode provided in proximity to the detection electrode; and the capacitance detection device for detecting the capacitance between the object and the detection electrode according to claim 9.

11. A capacitance detection device for detecting a capacitance between an object proximate to a detection electrode and the detection electrode, the capacitance detection device comprising:

a first voltage output circuit configured to output a first alternating current voltage supplied to a shield electrode disposed proximate to the detection electrode;

a second voltage output circuit configured to output a second alternating current voltage, frequency and phase of the second alternating current voltage being equal to those of the first alternating current voltage and amplitude of the second alternating current voltage being less than that of the first alternating current voltage; and a current output circuit configured to output a drive current to the detection electrode so that a voltage difference between a voltage of the detection electrode and the second alternating current voltage is reduced, and output a detection signal corresponding to the drive current, wherein the second voltage output circuit outputs the second alternating current voltage with amplitude adjusted so that the drive current becomes zero in the absence of the object proximate to the detection electrode, wherein the current output circuit includes an operational amplifier for amplifying a voltage difference between an inverting input terminal connected to the detection electrode and a non-inverting input terminal to which the second alternating current voltage is applied, and outputting the amplified result as the detection signal, and a feedback circuit provided in a path between an output terminal of the detection signal of the operational amplifier and the inverting input terminal, and the capacitance detection device further comprising:

a subtraction circuit of subtracting, from the detection signal, a reference alternating current voltage corresponding to an alternating current voltage output as the detection signal from the operational amplifier in the absence of the object proximate to the detection electrode.

12. The capacitance detection device according to claim 11, wherein the detection signal and the first alternating current voltage are input to the subtraction circuit, and the subtraction circuit subtracts, from the detection signal, the reference alternating current voltage that is obtained by attenuating the first alternating current voltage.

13. The capacitance detection device according to claim 12, wherein the subtraction circuit outputs, as a differential signal, a result of subtracting the reference alternating current voltage from the detection signal.

14. An input device used for inputting information according to the proximity of the object, the input device comprising:

at least one detection electrode, the capacitance between the detection electrode and the object changing according to the proximity of the object;

a shield electrode provided in proximity to the detection electrode; and the capacitance detection device for detecting the capacitance between the object and the detection electrode according to claim 11.

15. A capacitance detection device for detecting a capacitance between an object proximate to a detection electrode and the detection electrode, the capacitance detection device comprising:

a first voltage output circuit configured to output a first alternating current voltage supplied to a shield electrode disposed proximate to the detection electrode;

a second voltage output circuit configured to output a second alternating current voltage, frequency and phase of the second alternating current voltage being equal to those of the first alternating current voltage and amplitude of the second alternating current voltage being less than that of the first alternating current voltage; and a current output circuit configured to output a drive current to the detection electrode so that a voltage difference between a voltage of the detection electrode and the second alternating current voltage is reduced, and output a detection signal corresponding to the drive current, wherein the second voltage output circuit outputs the second alternating current voltage with amplitude adjusted so that the drive current becomes zero in the absence of the object proximate to the detection electrode, wherein the current output circuit includes an operational amplifier for amplifying a voltage difference between an inverting input terminal connected to the detection electrode and a non-inverting input terminal to which the second alternating current voltage is applied, and outputting the amplified result as the detection signal, a feedback circuit provided in a path between an output terminal of the detection signal of the operational amplifier and a common node, a first switch circuit for selecting one of a plurality of input nodes, and connecting it to the common node, and a second switch circuit for selecting the same one of the plurality of input nodes as the first switch circuit, and connecting it to the inverting input terminal, and the plurality of input nodes are connected to different detection electrodes, respectively.

16. The capacitance detection device according to claim 15, wherein the current output circuit includes a plurality of first resistors provided in a plurality of paths between the plurality of input nodes and corresponding detection electrodes, and the feedback circuit includes a feedback capacitor and a feedback resistor connected in parallel.

17. The capacitance detection device according to claim 16, wherein the first voltage output circuit and the second voltage output circuit are each enabled to change the frequency of an output alternating current voltage, and the first resistor is a variable resistor whose resistance value is changed according to the frequency of the first alternating current voltage and the second alternating current voltage.

18. The capacitance detection device according to claim 15, wherein the current output circuit includes a plurality of first resistors provided in a plurality of paths between the plurality of input nodes and the corresponding plurality of detection electrodes, a third switch circuit for selecting one of a plurality of connection nodes for connecting the plurality of detection electrodes and the corresponding first resistors, and connecting it to the output terminal of the operational amplifier, and a feedback resistor provided at a path between the third switch circuit and the output terminal, and the feedback circuit includes a feedback capacitor.

19. An input device used for inputting information according to the proximity of the object, the input device comprising:

at least one detection electrode, the capacitance between the detection electrode and the object changing according to the proximity of the object;

a shield electrode provided in proximity to the detection electrode; and the capacitance detection device for detecting the capacitance between the object and the detection electrode according to claim 15.

* * * * *